(12) United States Patent
Calvet et al.

(10) Patent No.: US 6,661,955 B1
(45) Date of Patent: Dec. 9, 2003

(54) KINEMATIC AND NON-KINEMATIC PASSIVE ALIGNMENT ASSEMBLIES AND METHODS OF MAKING THE SAME

(75) Inventors: Robert J. Calvet, Pasadena, CA (US); Roman C. Gutierrez, La Crescenta, CA (US); Tony Kai Tang, Glendale, CA (US)

(73) Assignee: Siwave, Inc., Arcadia, CA (US)

( * ) Notice: Subject to any disclaimer, the term of this patent is extended or adjusted under 35 U.S.C. 154(b) by 0 days.

(21) Appl. No.: 10/067,420

(22) Filed: Feb. 4, 2002

(51) Int. Cl.⁷ .................................................. G02B 6/30
(52) U.S. Cl. ........................................ 385/49; 385/52
(58) Field of Search ............................ 385/49, 52, 59, 385/65, 83

(56) References Cited

U.S. PATENT DOCUMENTS

| | | | |
|---|---|---|---|
| 4,696,692 A | 9/1987 | Schmitt | 65/102 |
| 5,004,205 A | 4/1991 | Brown et al. | 248/476 |
| 5,163,108 A | 11/1992 | Armiento et al. | 385/89 |
| 5,469,893 A | 11/1995 | Caveney et al. | 138/162 |
| 5,678,944 A | 10/1997 | Slocum et al. | 403/13 |
| 5,733,024 A | 3/1998 | Slocum et al. | 312/223.2 |
| 5,748,827 A | 5/1998 | Holl et al. | 385/1.34 |
| 5,803,402 A | 9/1998 | Krumweide et al. | 244/117 R |
| 5,821,764 A | 10/1998 | Slocum et al. | 324/758 |
| 5,857,049 A | 1/1999 | Beranek et al. | 385/91 |
| 5,905,831 A | 5/1999 | Boudreau et al. | 385/88 |
| 5,913,002 A | 6/1999 | Jiang | 385/88 |
| 5,915,678 A | 6/1999 | Slocum et al. | 269/47 |
| 5,964,397 A | 10/1999 | Dautartas | 228/180.22 |
| 6,085,007 A | 7/2000 | Jiang et al. | 385/92 |
| 6,118,917 A | 9/2000 | Lee et al. | 285/49 |
| 6,127,254 A | 10/2000 | Diebold et al. | 438/613 |
| 6,157,759 A | 12/2000 | Seo et al. | 385/49 |
| 6,160,672 A | 12/2000 | Chan et al. | 359/819 |
| 6,170,157 B1 | 1/2001 | Munk et al. | 29/897.2 |
| 6,195,407 B1 | 2/2001 | Dobbs et al. | 378/4 |
| 6,314,630 B1 | 11/2001 | Munk et al. | 29/407.01 |

*Primary Examiner*—Tulsidas Patel
(74) *Attorney, Agent, or Firm*—Fish and Richardson P.C.

(57) ABSTRACT

Micromachined passive alignment assemblies and methods of using and making the same are provided. The alignment assemblies are used to align at least one optical element. The alignment assemblies may be configured with kinematic, pseudo-kinematic, redundant or degenerate support structures. One alignment assembly comprises a base and a payload, which supports at least one optical element. The payload may be coupled to the base via connecting structures. The base, the payload and/or the connecting structures may have internal flexure assemblies for preloading a connection, thermal compensation and/or strain isolation.

20 Claims, 36 Drawing Sheets

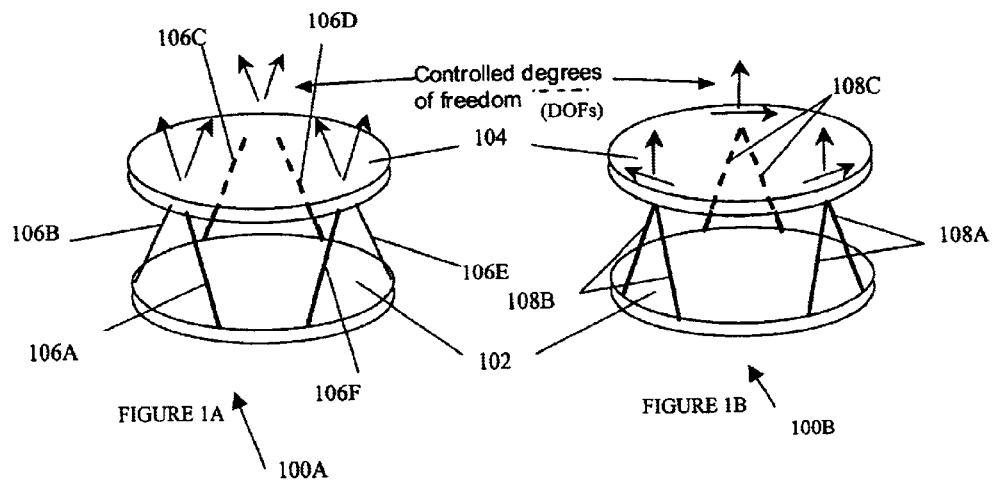
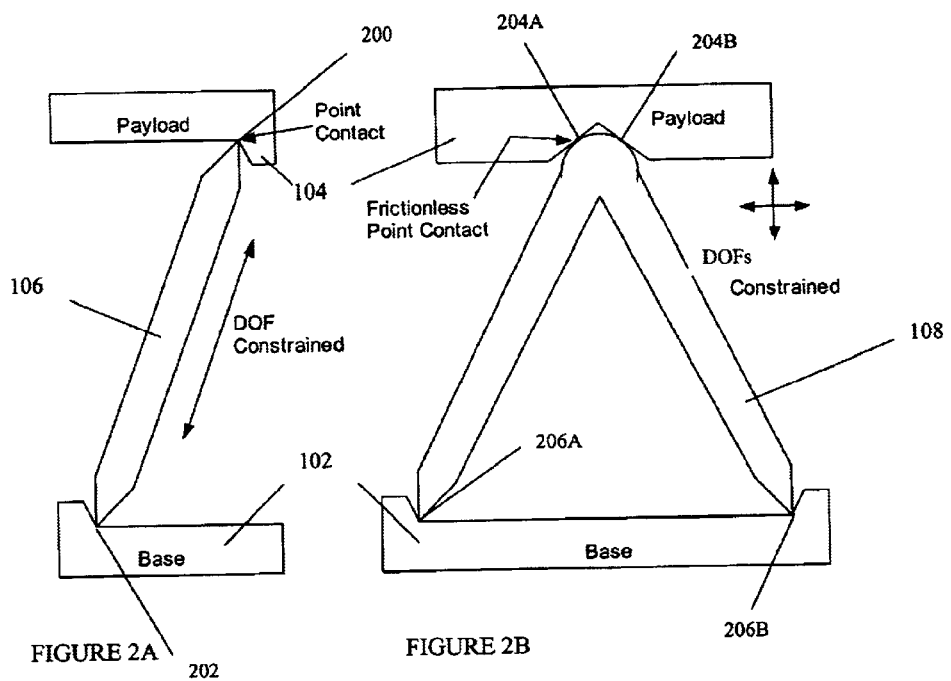

The process of making parts for 3D precision structures may be flow-charted as follows:

The process of assembling 3D structures from planar parts is:

Note: A bottom-to-top topology is assumed here (as in Figure 1: a base, 3 connecting elements (bipods), and a payload). If the topology is more complex (such as a ring), a more complex assembly procedure is required, possibly also requiring jigs/fixtures.

KINEMATIC AND NON-KINEMATIC PASSIVE ALIGNMENT ASSEMBLIES AND METHODS OF MAKING THE SAME

INCORPORATIONS BY REFERENCE

Co-assigned U.S. patent application Ser. No. 09/855,305, entitled "Angled Fiber Termination And Methods Of Making The Same", filed on May 15, 2001, is hereby incorporated by reference in its entirety.

Another co-assigned U.S. patent application Ser. No. 10/001092, entitled "Optical Element Support Structure And Methods Of Using And Making The Same", filed on Nov. 15, 2001, is hereby incorporated by reference in its entirety.

BACKGROUND OF THE INVENTION

1. Field of the Invention

The present invention relates generally to optical devices, and more particularly to optical element alignment assemblies and methods of making the same.

2. Description of the Related Art

An optical component, such as a mirror, lens or fiber, in an optical instrument or device, such as an optical switch, should be accurately located/positioned with respect to another optical component in order for the optical instrument or device to function properly. Thus, optical devices may require their components to be placed with exacting tolerances to fulfill design objectives.

Conventional passive alignment assemblies for Micro-ElectroMechanical System (MEMS) devices are typically planar in nature and only align local elements, e.g., a fiber and ball lens collimator, where the two components are within a few millimeters of each other. Alignments over larger distances (e.g., greater than five millimeters), and three-dimensional optical systems typically use conventionally machined components. Such assemblies often fail to align optical components with high intrinsic precision.

SUMMARY OF THE INVENTION

Components generally need to be located in three dimensions, i.e., distributed in a volume of space, and have three rotations specified and/or controlled. Components located in a plane (two dimensions) with three or fewer rotations specified and/or controlled are a subset of the general case. Other design objectives may include: (1) locate components without induced strains, either from the process of mounting or through bulk temperature changes of constituent parts, and/or (2) support components as rigidly as possible.

In accordance with the present invention, alignment assemblies and methods of using and making the assemblies are provided. An important advantage of several embodiments of the invention is to completely orient one body with respect to another body to a high degree of precision by providing (1) precise mating features between bodies and connecting elements, and (2) precise distances between these features on all bodies and connecting elements.

In one embodiment, the alignment assemblies are passive, kinematic or non-kinematic, and micromachined. "Passive alignment" means the various parts or devices to be assembled have mating features such that when these features are engaged with each other, the correct alignment (typically optical) is attained. In some instances, the engagement of these mating features permanently controls the alignment. In other instances, some type of fixture will hold the parts with their mating features engaged while some additional fixation, e.g., glue or bolt, is added to make the engagement permanent.

For comparison, in "active" alignment, two parts or devices are maneuvered with respect to each other by some motion control mechanism, e.g., a motorized motion stage, shim set, etc., in one or more directions or degrees-of-freedom (DOF) until some metric, e.g., light through-put, optical beam quality, etc., is within a specified tolerance. At that point, the two parts are fixed rigidly with respect to each other by some means, e.g., glue, solder, bolt.

As defined and used herein, "kinematic mounting" relates to attaching two bodies, which may be called a base assembly or a payload assembly, together by forming a structural path and creating stiffness between the two bodies in six, and only six, independent degrees of freedom ("DOFs") or directions. Each degree of freedom (DOF) kinematically controlled between two bodies is also a position defined, i.e., a specific value of that DOF, as a linear measurement, may be maintained. Six DOFs are desired because the location of any object in space is defined by three orthogonal coordinates, and the attitude of the object is defined by three orthogonal rotations.

A kinematic support has the advantage of being stiff, yet any strains or distortions in the base assembly are not communicated to the payload assembly. Thus, any sensitive optical alignments are not altered in the payload assembly if the base assembly undergoes deformation due to applied loads or bulk temperature changes.

In one embodiment, it is desirable to tailor a DOF based on the configuration of a "pseudo-kinematic" support. "Pseudo-kinematic" means that although there may be many DOFs connecting at least two bodies, such as two micromachined passive alignment assemblies, in a practical attachment scheme, the DOFs can be tailored such that only six DOFs have a relatively high stiffness, and substantially all other DOFs have a relatively low stiffness.

Thus, true "kinematic" support means only 6 stiff DOFs connecting two parts, and no other stiffness paths exist. "Pseudo-kinematic" means there are 6 DOFs with relatively high stiffness, and possibly many more with much lower stiffness (typically two to three orders of magnitude less). In some applications, it is desirable to have pseudo-kinematic DOFs with relatively low stiffness to be two to three orders of magnitude lower than DOFs with relatively high stiffness.

DOFs with different levels of stiffness may be accomplished using a flexure system to relieve stiffness in unwanted DOFs. Depending on the cross-sectional properties of elements in the flexure system, connecting elements between two bodies may attain the desired stiffness connectivities.

The alignment assemblies and methods of making the assemblies according to the invention may provide a number of advantages. For example, the micromachined passive alignment assemblies may be made with high intrinsic precision. Micromachining processes may form three-dimensional structures from a substrate wafer with high accuracy. In several embodiments, one micromachined passive alignment assembly may be oriented and spaced with respect to another assembly (e.g., with connecting elements) with lithographic precision, e.g., three-dimensional translational positioning to less than one micron and three-dimensional angular positioning to less than five arcseconds for an assembly with a 50-mm characteristic dimension.

The methods according to the invention may construct mating surfaces on micromachined passive alignment assemblies, such as a base assembly and a payload assembly, to control six independent DOFs between the assemblies and allow complete, high-precision specification of position and attitude. In some applications, it is desirable to have micromachined connecting elements with counterpart mating surfaces to mate with the mating surfaces on the base and payload assemblies.

The accuracy of micromachined passive alignment assemblies may be fully realized if there is a positive contact between a pair of mating features. Thus, some form of preload or force may be applied to maintain compressive contact between the pair of mating features. An external force may be applied to preload mating surfaces to contact each other prior to gluing. Glues that shrink on cure may be used to maintain the preload across mating surfaces after assembly.

In addition to or instead of an external force, any of the structural elements being assembled may have an internal flexure assembly that applies an internally-reacted force (preload). The internal flexure assembly may seat mating surfaces without a deadband. In one embodiment, the internal flexure assembly comprises a set of double parallel motion flexures, a preloader stage, and a hole on one side of the preloader stage for inserting a separate preloader pin. When the preloader pin is inserted into the hole of the internal flexure assembly, the preloader stage deflects and exerts a force on the pin, which exerts a preload against a mating surface. After the micromachined passive alignment assemblies are assembled, the mating surfaces may be glued or bonded if desired.

A connecting element may be configured to restrain the base assembly and the payload assembly with one or more desired DOFs. In some embodiments, a "degenerate" support or connecting element may be used where less than six constrained DOFs between a base and payload are desired. The degenerate support may allow some trajectory (i.e., a combination of Cartesian DOFs) of a payload assembly relative to a base assembly to be unconstrained.

A "redundant" support or connecting element may be used in applications where more than six DOFs are desired. The redundant support reinforces the base and payload assemblies and maintains their flatness.

As another example, a micromachined passive alignment assembly may have thermal compensation flexure assemblies for maintaining centration of optical elements in the presence of large bulk or local temperature differences. The optical elements may then be attached to at least three pads supported by these flexure assemblies to effect this stable positioning. In some applications, it is desirable to position a plurality of optical elements in a precise pattern in the presence of large bulk or local temperature differences. In some of these applications, it may be desirable to position a plurality of thermal compensation flexure assemblies concentric with respect to the center of an opening and equidistant with respect to each other.

One aspect of the invention relates to an assembly configured to support at least one optical element to a pre-determined position. The assembly comprises a first micromachined structure having at least a first mating part and a second micromachined structure having at least a second mating part. The second mating part is configured to contact the first mating part to constrain the second micromachined structure with respect to the first micromachined structure. The second micromachined structure is configured to support at least one optical element.

In one embodiment, the second mating part is configured to contact the first mating part to precisely position the second micromachined structure with respect to the first micromachined structure. In one embodiment, the optical element is then precisely positioned with respect to the first micromachined structure. In one embodiment, the first micromachined structure also supports one or more optical elements.

Another aspect of the invention relates to an assembly configured to support at least one optical element. The assembly comprises a first micromachined structure having at least a first attachment point and a second micromachined structure having at least a second attachment point. The second attachment point is configured to contact the first attachment point to restrain the second micromachined structure with respect to the first micromachined structure in at least one degree-of-freedom (DOF). The second micromachined structure is configured to support at least one optical element at a predetermined position.

In one embodiment, the second attachment point is configured to contact the first attachment point to restrain and align the second micromachined structure with respect to the first micromachined structure. In one embodiment, the optical element is then aligned to a pre-determined position with respect to the first micromachined structure. In one embodiment, the first micromachined structure also supports one or more optical elements.

Another aspect of the invention relates to a method of making an assembly configured to position an optical element to a pre-determined position. The method comprises using lithography to form a first pattern and a second pattern on a substrate for a first structure and a second structure. The first pattern outlines a first mating part of the first structure. The second pattern outlines a second mating part of the second structure. The method comprises etching the substrate to form the first and second structures according to the first and second patterns. The second mating part is configured to contact the first mating part to constrain the second structure with respect to the first structure. The second structure is configured to position at least one optical element.

One aspect of the invention relates to an assembly configured to support at least one optical element to a pre-determined position. The assembly comprises a micromachined base, a payload and a connecting structure. The base has a first mating part. The payload is configured to position the optical element. The payload has a second mating part. The connecting structure is configured to contact the first mating part of the base and the second mating part of the payload. The connecting structure constrains the payload in about five to about six degrees of freedom with respect to the base.

In one embodiment, the base also positions an optical element.

Another aspect of the invention relates to an assembly configured to position at least one optical element to a pre-determined position. The assembly comprises a base plate and at least one side plate configured to connect to the base plate. The base plate and the side plate are configured to support a plurality of payload plates. Each payload plate is configured to connect to the side plate and to the base plate. Each payload plate is configured to position at least one optical element.

Another aspect of the invention relates to a method of making an assembly configured to position at least one optical element to a pre-determined position. The method comprises using lithography to form a first pattern, a second pattern and a third pattern on a substrate for a base, a payload and a connecting structure. The first pattern outlines a first mating part of the base. The second pattern outlines a second mating part of the payload. The third pattern outlines third and fourth mating parts of the connecting structure. The method further comprises etching the substrate to form the base, the payload and the connecting structure according to the first, second and third patterns. The connecting structure is configured to contact the first mating part of the base and the second mating part of the payload. The connecting structure constrains the payload in about five to about six degrees of freedom with respect to the base. The payload is configured to position an optical element.

One aspect of the invention relates to a micromachined flexure assembly formed in a first structure that is a part of an optical element alignment assembly. The flexure assembly comprises a set of parallel motion flexures and a pre-loader stage coupled to the set of parallel motion flexures. The set of parallel motion flexures allows the preloader stage to deflect away from a second structure of the optical element alignment assembly and apply a load against the second structure to constrain the second structure in at least one degree of freedom with respect to the first structure.

Another aspect of the invention relates to a micromachined thermal compensation flexure assembly formed in a first structure that is a part of an optical element alignment assembly. The flexure assembly comprises a set of collinear flexures and a center stage coupled to the set of collinear flexures. The set of collinear flexures and the center stage are configured to limit distortions in one direction due to a temperature change in the first structure from affecting an optical element supported by the first structure.

In one embodiment, three or more such assemblies may completely support a second structure, e.g., an optical element or assembly, with respect to the first structure such that there are minimal internal stresses, and hence distortions, in the second structure in the presence of bulk temperature changes or substantial temperature differences between the structures.

Another aspect of the invention relates to a micromachined strain isolation flexure assembly formed in a first structure that is a part of an optical element alignment assembly. The flexure assembly comprises a set of collinear flexures and a center stage coupled to the set of collinear flexures. The set of collinear flexures and the center stage are configured to limit strains in one direction in the first structure from transferring to a second structure.

Three or more such assemblies may completely isolate a second structure, e.g., an optical element or assembly, with respect to the first structure such that there are minimal internal stresses, and hence distortions, in the second structure in the presence of mechanically or inertially induced distortions in the first structure.

Another aspect of the invention relates to a method of making a micromachined flexure assembly in a structure that is a part of an optical element alignment assembly. The method comprises using lithography to form a pattern on a substrate for the structure. The pattern outlines a set of collinear flexures and a center stage coupled to the set of collinear flexures. The method further comprises etching the substrate to form the structure according to the pattern.

BRIEF DESCRIPTION OF THE DRAWINGS

FIG. 1A is a three-dimensional view of one kinematic support configuration.

FIG. 1B is a three-dimensional view of another kinematic support configuration.

FIG. 2A is a side view of a monopod connecting element shown in FIG. 1A.

FIG. 2B is a side view of a bipod connecting element shown in FIG. 1B.

DETAILED DESCRIPTION

Figure 3A:
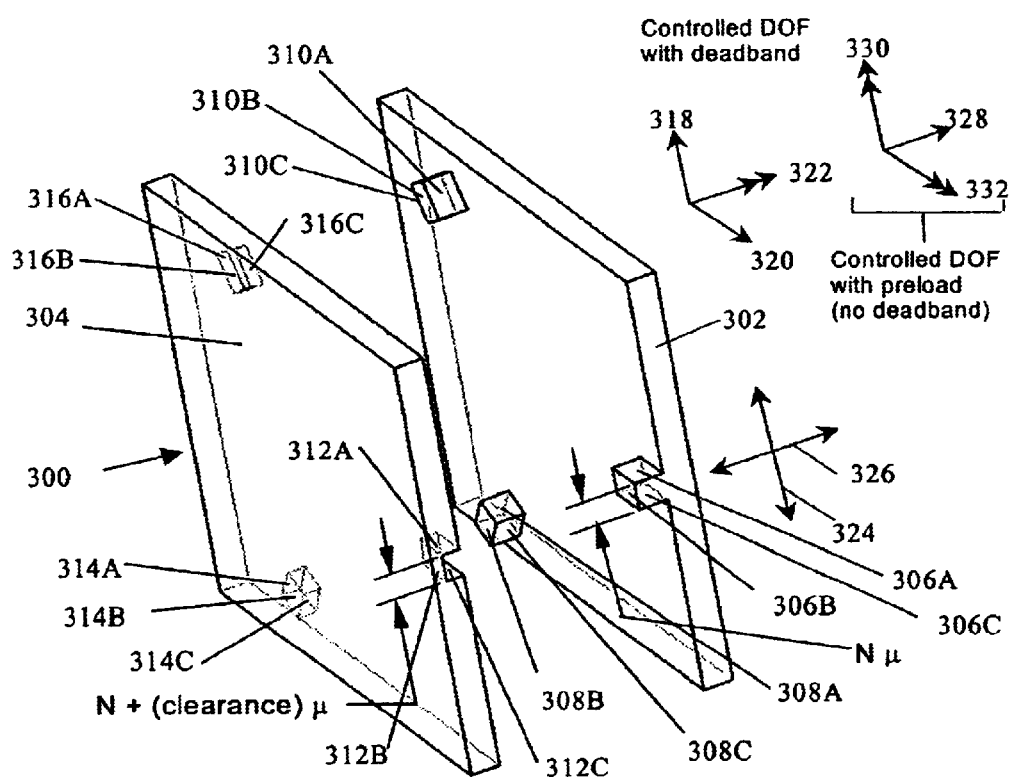
FIGS. 3A–3I are views of slip-fit joint assemblies with optical elements.

FIG. 1A is a three-dimensional schematic view of one kinematic support configuration 100A. The kinematic support configuration 100A in FIG. 1A comprises a base assembly 102, a payload assembly 104 and six monopod connecting elements 106A–106F (individually or collectively referred to herein as "monopod connecting element 106"). In one configuration, the base assembly 102 is a base support structure, and the payload assembly 104 holds or aligns an optical element, such as an optical fiber, lens or mirror. The base assembly 102 is connected to the payload assembly 104 via the six monopod connecting elements 106A–106F.

Each monopod connecting element 106 in FIG. 1A constrains one degree of freedom (hereinafter referred to as 'DOF') between the base assembly 102 and the payload assembly 104, as shown by an arrow above the kinematic support configuration 100A in FIG. 1A. A constrained DOF may be referred to as a 'stiff' DOF or a restrained DOF. The relevant reference parameter for translational stiffness or translational DOF is force, while the relevant reference parameter for rotational stiffness or rotational DOF is torque.

FIG. 1B is a three-dimensional schematic view of another kinematic support configuration 100B. The kinematic support configuration 100B in FIG. 1B comprises a base assembly 102, a payload assembly 104 and three bipod connecting elements 108A–108C (individually or collectively referred to herein as "bipod connecting element 108"). The base assembly 102 is connected to the payload assembly 104 via the three bipod connecting elements 108A–108C. Each bipod connecting element 108 constrains two DOFs between the base assembly 102 and the payload assembly 104, as shown by a pair of arrows near the kinematic support configuration 100B in FIG. 1B. In one embodiment, the kinematic support configurations 100A, 100B each have a structural path between the base assembly 102 and the payload assembly 104 in six independent DOFs, as shown by the arrows in FIGS. 1A, 1B. Six DOFs of constraint may be desired for some optic alignment applications.

The kinematic support configurations 100A, 100B in FIGS. 1A and 1B have the advantage of being as stiff as the connecting elements 106A–106F, 108A–108C, but any strain or distortion in the base assembly 102 will not be transferred to the payload assembly 104 (although a positional or attitude change may occur). Thus, any sensitive optical elements aligned within the payload assembly 104 will not be affected if applied loads or bulk temperature changes deform the base assembly 102.

Similarly, if the payload 104 grows or shrinks, there will be no forces transferred to the base assembly 102 because of the connecting elements 106A–106F, 108A–108C. But there may be a change in position or attitude between the base 102 and the payload 104. For the symmetric support configurations shown in FIGS. 1A and 1B, the only change is in the vertical direction between the two bodies 102, 104. The payload 104 may be rigidly supported and maintains position in the presence of environmental conditions, such as inertial loads.

The location of an object in space is defined by three orthogonal coordinates or vectors, and the attitude of the object is defined by three orthogonal rotations with respect to the three vectors. In accordance with the present invention, if the components of an assembly (e.g., base, payload, and connecting structure such as bipods or monopods) are formed using an extremely precise fabrication method (e.g., micromachining), then the location and attitude of a payload relative to a base may be specified as precisely by fabricating connecting structure to calculated dimensions along their support DOF(s) (e.g., a precise length for a monopod, or a precise vertical and horizontal point of contact for a bipod).

Degenerate Support

If there are fewer than six DOFs constrained between the base 102 and the payload 104, there may be some trajectory, i.e., combination of Cartesian DOFs, of the payload 104 relative to the base 102 that is unconstrained. In this case, the support between the base 102 and the payload 104 may be called "degenerate," and may occur when a connecting element 106 or 108 is missing or when certain connecting elements 106, 108 are parallel. Arbitrarily complex patterns of motion may be created or controlled by replacing one linear connecting element 106 or 108 with a linear actuator.

Redundant Support

If there are more than six DOFs constrained between the base 102 and payload 104, and the base 102 distorts or warps, there will be no solution of payload position and attitude that does not also warp the payload 104. This type of support may be called "redundant."

Monopods and Bipods

FIG. 2A is a schematic side view of a monopod connecting element 106 shown in FIG. 1A. The monopod connecting element 106 in FIG. 2A constrains the base and payload assemblies 102, 104 with point contacts 200, 202 at two ends.

FIG. 2B is a schematic side view of a bipod connecting element 108 shown in FIG. 1B. The bipod connecting element 108 in FIG. 2B constrains the base and payload assemblies 102, 104 with one or more (ideally) frictionless point contacts 204A, 204B at one end and two point contacts 206A, 206B at the other end.

The DOFs restrained by the monopod and bipod connecting elements 106, 108 are indicated by arrows in FIGS. 2A and 2B. Six monopod connecting elements 106A–106F may constrain six DOFs between the base and payload assemblies 102, 104, as shown by the arrows in FIG. 1A. Also, three bipod connecting elements 108A–108C may constrain six different DOFs between the base and payload assemblies 102, 104, as shown by the arrows in FIG. 1B.

Both types of joints (point-in-groove joint in FIG. 2A and circle-in-groove joint in FIG. 2B) may be used interchangeably. A preload may be used to maintain contact between the base 102, connecting element 106 or 108 and payload 104 in FIGS. 2A and 2B.

Micromachining

The base and payload assemblies 102, 104 and the connecting elements 106A–106F, 108A–108C in FIGS. 1A, 1B, 2A and 2B may be hereinafter referred to collectively as a "micromachined passive alignment assembly" or a "micromachined assembly." Other micromachined alignment assemblies are described below. A micromachined assembly may be formed with methods described below with reference to FIGS. 31–33.

In general, each component in the micromachined assembly in FIGS. 1A, 1B, 2A and 2B may be formed by first using a patterning process, such as lithography or photolithography, to form a desired pattern on a substrate wafer. The substrate wafer may comprise silicon or another suitable material, such as gallium arsenide or germanium. The lithography process may include applying a resist on a surface of a substrate wafer, aligning a mask with a desired pattern above the substrate wafer, exposing the resist to radiation, developing the resist, and hardbaking the resist.

The radiation used for patterning the substrate wafer may include, by way of example, an ultraviolet light, an X-ray beam, or a beam of electrons. In one embodiment, the mask is made of a mechanically rigid material that has a low coefficient of thermal expansion. For example, the mask may be made of quartz, borosilicates, metallic chrome, or iron oxide. Patterning may be accomplished using either negative or positive resists. In some applications, it is desirable to use positive resists with aspect ratios above unity. In some applications, a photolithographic process is used to form a desired pattern on the substrate wafer. In a photolithography process, a photoresist such as photosensitive film is used in the patterning process.

After developing a pattern on the resist, one or more micromachining fabrication processes, such as Deep Reactive Ion Etching (DRIE), Wire Electric Discharge Machining (Wire EDM or WEDM), LIGA (X-Ray lithographie, galvanoformung, und abformtechnik) (X-Ray lithography, electrodeposition, and molding), or SCREAM (Single Crystal Reactive Etching and Metallization) may be used to etch the substrate wafer according to the masked pattern. In some applications, it is desirable to etch deep and straight sidewalls in the substrate wafer. In other applications, it is desirable to form a three-dimensional structure from the patterned wafer.

After etching, the patterned wafer is cleansed. The photoresist and/or resist may be removed using a solvent such as acetone. If there are other fragile MEMs structures on the wafer, a plasma etch may also be used to clean the substrate wafer.

Figure 31:
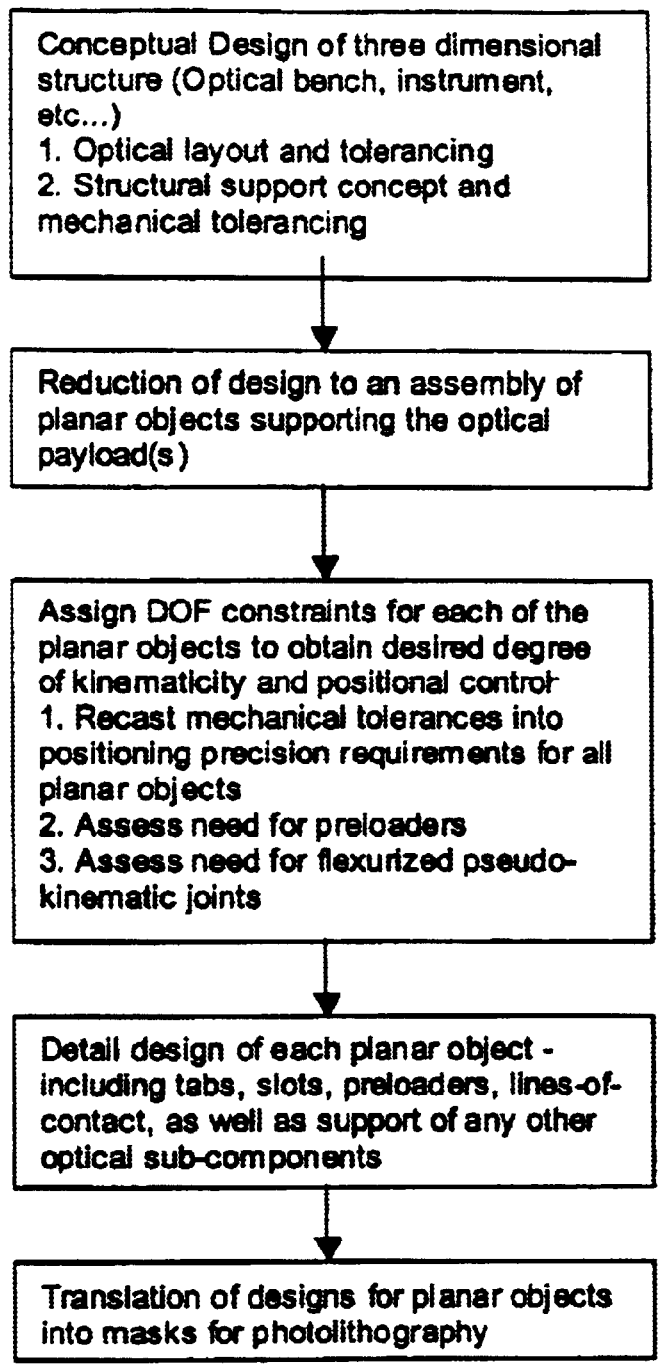
FIG. 31 illustrates one method of designing the three-dimensional structures and assemblies described above and translating the designs into masks for high precision microlithography/photolithography.
Figure 32:
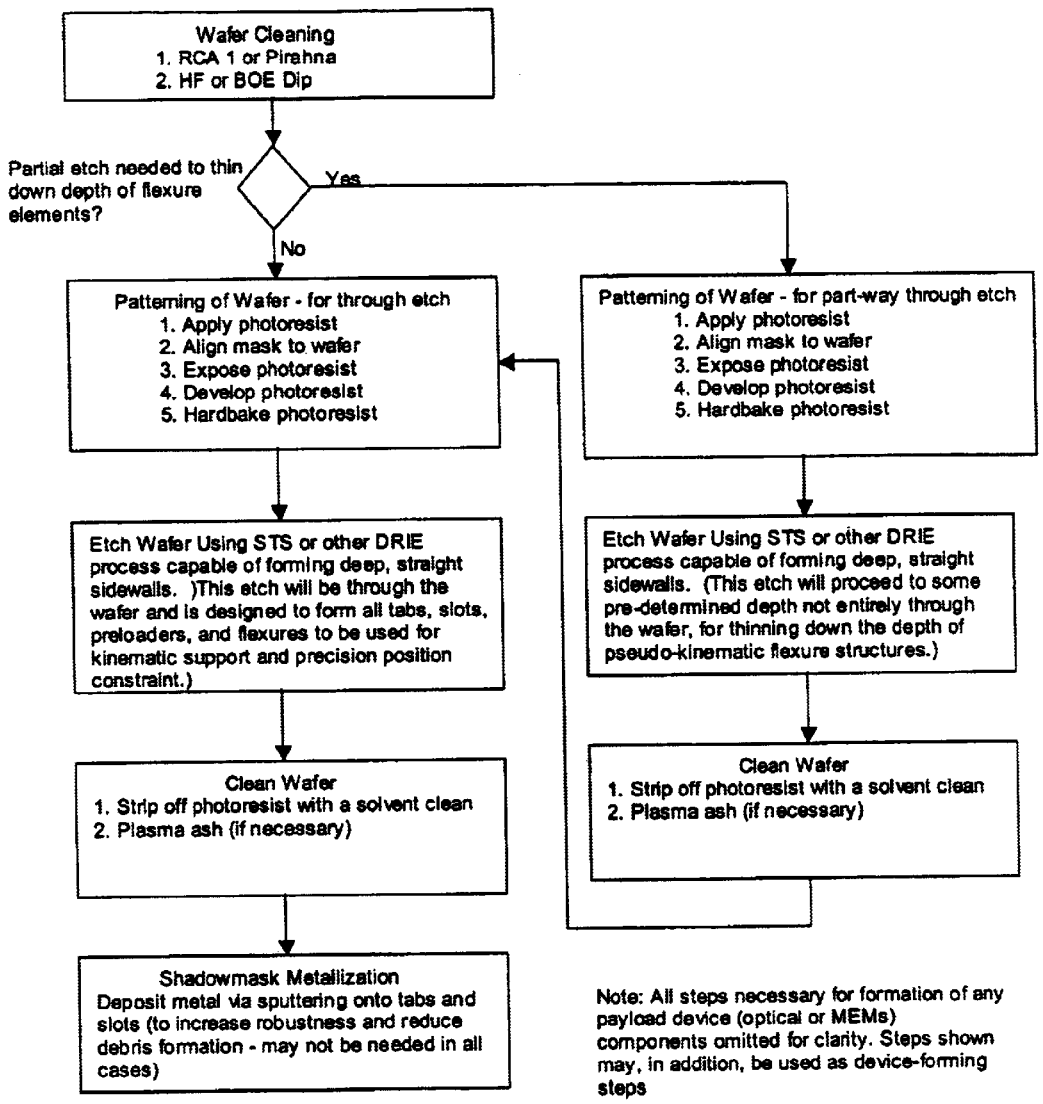
FIG. 32 illustrates one method of making high precision, three-dimensional structures described above.
Figure 33:
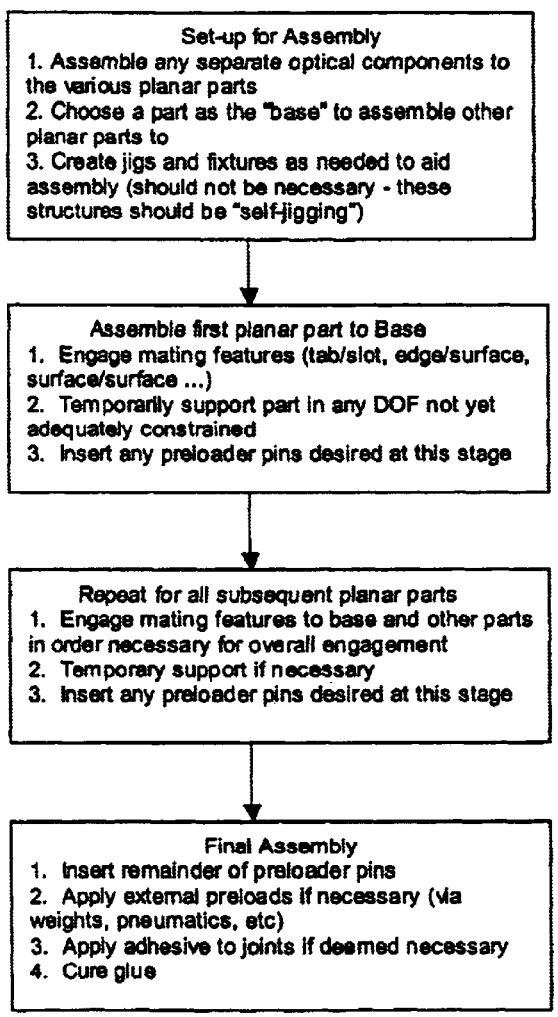
FIG. 33 illustrates one method of assembling three-dimensional structures described above from planar parts.

After the fabricated components are cleansed, the components are assembled to form a desired micromachined passive alignment assembly. The fabrication processes described above may be used for making any part, element, patterned wafer, or component of the micromachined passive alignment assemblies described herein. FIGS. 31–33 provide additional details on micromachining in accordance with the present invention.

Slip-Fit Joint

A slip-fit caged joint is a slip-together pair of features which control at least one DOF in both directions (which may be called "tension" and "compression"), where fit tolerance is added to intrinsic feature accuracy. Since fit tolerances can be held to 1–3 microns, the tolerance may be the dominant error. A slip-fit caged joint still forms a relatively high accuracy connection.

FIG. 3A is a three-dimensional view of one embodiment of a slip-fit joint assembly 300. The slip-fit joint assembly 300 comprises a payload assembly 302 and a base assembly 304. The payload assembly 302 has three protrusions (also called "tabs" or "male connectors") with mating surfaces 306A–306C, 308A–308C and 310A–310C (not all mating surfaces are visible in FIG. 3A). The base assembly 304 has counterpart grooves (also called "slots" or "female connectors") with mating surfaces 312A–312C, 314A–314C, and 316A–316C (not all mating surfaces are visible in FIG. 3A).

The mating surfaces 306A–306C, 308A–308C, 310A–310C, 312A–312C, 314A–314C, and 316A–316C are configured to engage together. The mating surfaces 306A, 306C, 308A, 308C, 310A, 310C of the payload assembly 302 that are normal to the payload plane are configured to slide past the corresponding mating surfaces 312A, 312C, 314A, 314C, 316A, 316C of the base assembly 304. A protrusion such as protrusion 306 and a groove such as groove 312 control at least two DOFs 324, 326 with a preload as shown in FIG. 3A and described below. A protrusion-groove pair may be called a kinematic positioning joint. Each groove has a pre-determined depth, which is less than a height of each protrusion. Each groove is configured to contact one of the protrusions and control the protrusion in two degrees of freedom when a preload is applied, as shown in FIG. 3A and described below. FIG. 3A also shows that each protrusion has four sidewalls, where each sidewall is substantially perpendicular to a plane of the payload 302. Each protrusion has a sidewall facing a center point of the payload 302.

In one embodiment, there is a fit clearance between the mating surfaces 306A, 306C, 308A, 308C, 310A, 310C, 312A, 312C, 314A, 314C, 316A, 316C to assemble the slip-fit joint assembly 300 of FIG. 3A. In some applications, it is desirable to have a fit clearance of about 1–3 microns For example, the distance between the mating surfaces 312A, 312C is equal to the distance between the mating surfaces 306A, 306C plus a few microns This fit clearance leads to positioning "slop" or "deadband" of a few microns in (1) the plane of the base assembly 304, which is defined by two DOFs 318 and 320, and (2) a few arcseconds in rotation about the normal of the base plane, which is shown as DOF 322. For rotational DOF 322 in FIG. 3A and other rotational DOFs described herein, such as DOFs 526, 528 in FIG. 5, the double arrows symbolize a rotation about the axis. Each double pair of mating surfaces 306A, 306C, 308A, 308C, 310A, 310C, 312A, 312C, 314A, 314C, 316A, 316C in FIG. 3A may contribute deadband (or free play) that is normal to their surfaces, which is shown as DOF 324.

In one embodiment, a preload is applied to seat the mating surfaces 306B, 308B, 310B, 312B, 314B, 316B that are parallel to the payload and base planes without a deadband in DOF 326. Thus, the position of the payload assembly 302 normal to the base plane, illustrated as DOF 328, is specifically controlled, as well as the two orthogonal rotations shown as DOFs 330 and 332, whose axis lie in the base plane. The DOFs 328, 330, 332 may be referred to as piston, tip, and tilt.

In embodiment of FIG. 3, the protrusions are square or rectangular in shape, while the female connectors are square or rectangular cavities. In other embodiments, other shapes may be used, such as cylindrical projections. With cylindrical projections, the restrained DOFs may be the same as described above, as specified by the base plane pairs 312A, 312C, 314A, 314C, 316A, 316C.

Figure 3B:
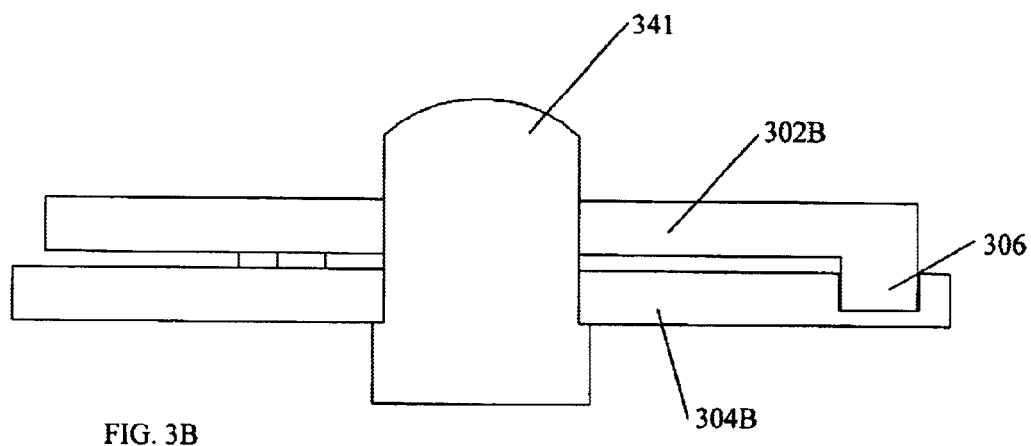
Figure 3C:
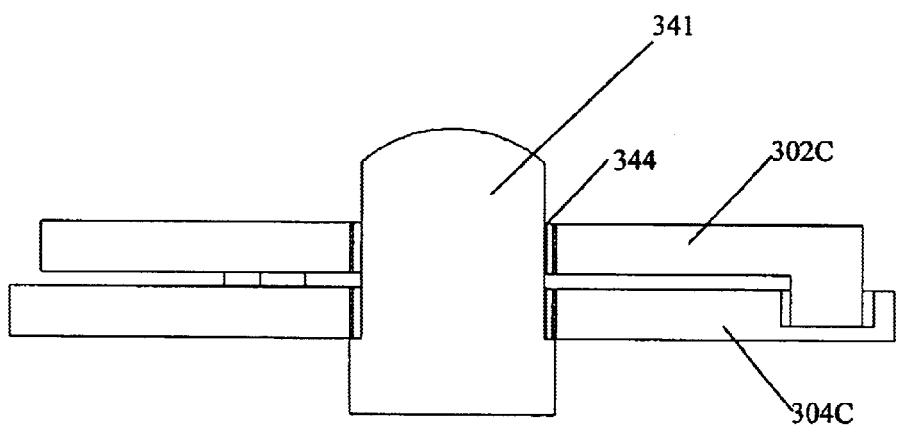
Figure 3D:
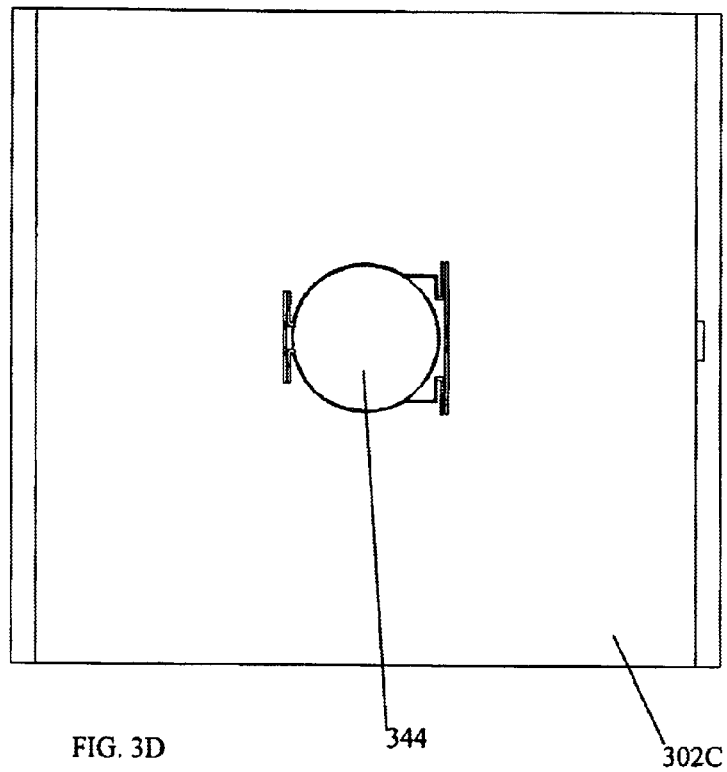

FIG. 3B is side view of a payload 302B with three protrusions (similar to FIG. 3A: one Protrusion 306 is shown in FIG. 3B), a base 304B and an optical element 341, such as a lens. FIG. 3C is a side view and FIG. 3D is a too view of a payload 302C (similar to FIG. 3A), a base 304C, an optical element 341, and a hole or receptacle 344, which the same as hole 2002 in FIGS. 20–21 described below.

Figure 3E:
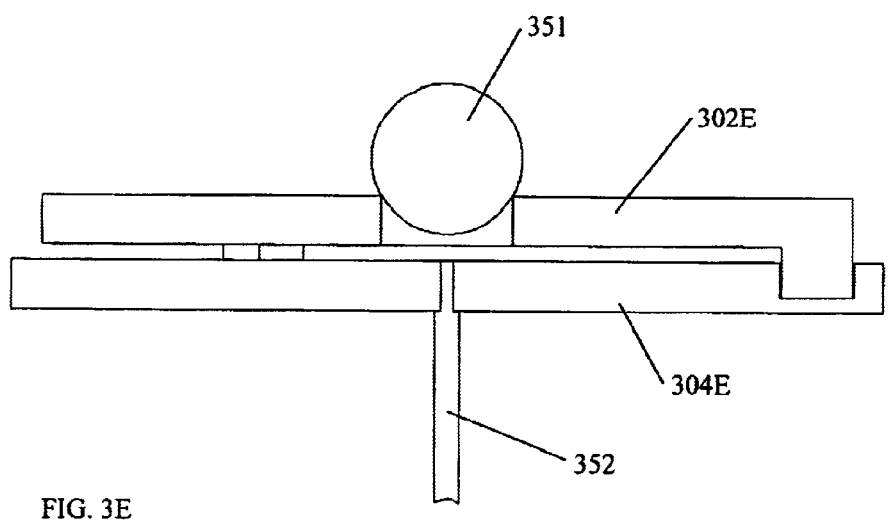
Figure 3F:
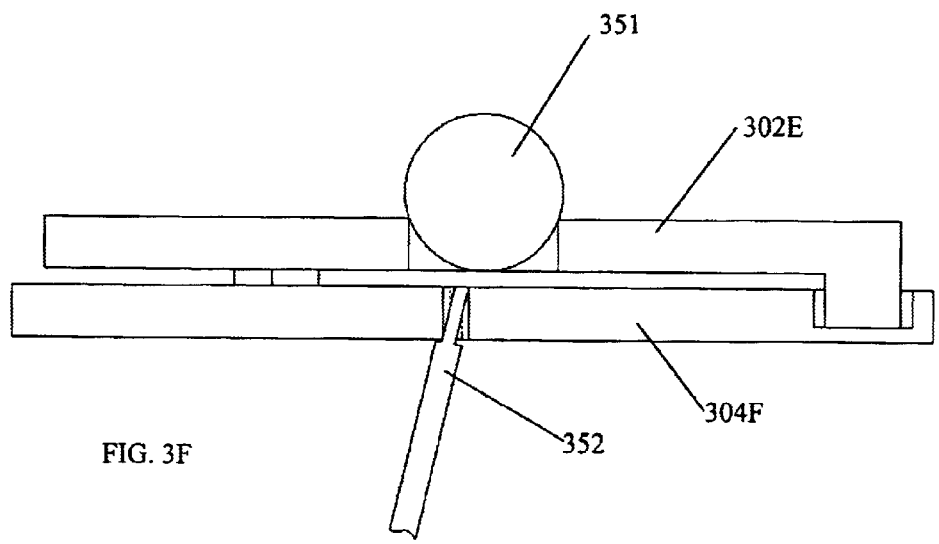

FIG. 3E is a side view of a payload 302E (similar to FIG. 3A), a base 304E, an optical element 351, such as a lens, and a fiber 352. FIG. 3F is the same as FIG. 3E except the base 304F holds the fiber 352 at an angle, as described in co-assigned U.S. patent application Ser. No. 09/955,305, entitled "Angled Fiber Termination And Methods Of Making The Same" which was incorporated above.

Figure 3G:
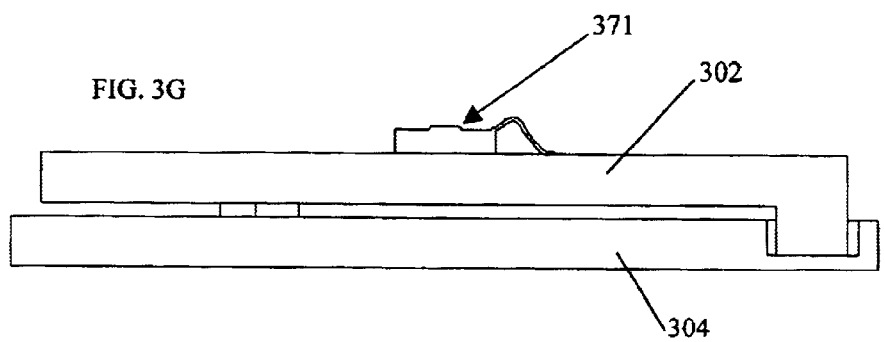

FIG. 3G is a side view of a payload 302 (similar to FIG. 3A), a base 304, and a diode 371.

Figure 3H:
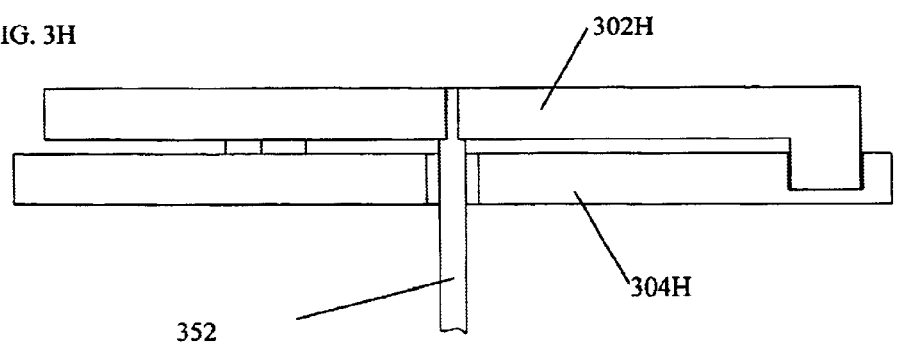

FIG. 3H is a side view of a payload 302H (similar to FIG. 3A), a base 304H, and an optical fiber 352.

Figure 3I:
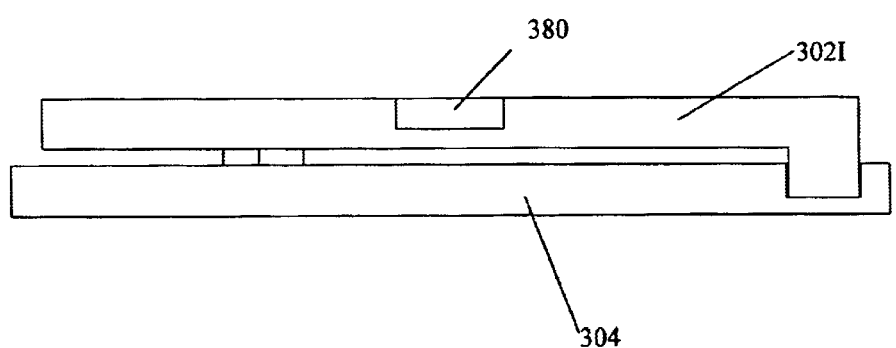

FIG. 3I is a side view of a payload 302I (similar to FIG. 3A), a base 304I, and an optical element, such as a mirror 380.

Figure 4:
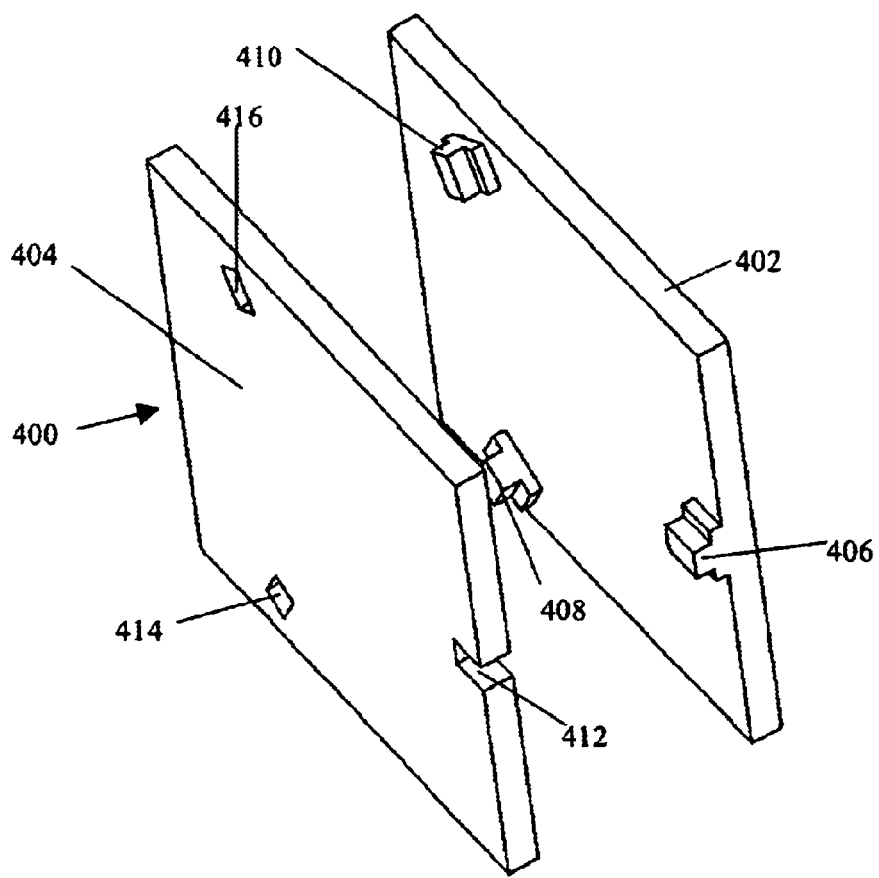
FIG. 4 is a three-dimensional view of another embodiment of a slip-fit joint assembly.

FIG. 4 is a three-dimensional view of another embodiment of a slip-fit joint assembly 400. The slip-fit joint assembly 400 comprises a base assembly 404 and a payload assembly 402. The payload assembly 402 has protrusions 406, 408 and 410 with mating surfaces, while the base assembly 404 has counterpart recesses 412, 414, and 416 with mating surfaces. Like the slip-fit joint assembly 300 of FIG. 3, the protrusions 406, 408, 410 and recesses 412, 414, and 416 with mating surfaces can engage together like male and female connectors. In this embodiment, the male connectors 406, 408 and 410 are inverted T-like projections, while the female connectors 412, 414, and 416 are window openings in the base assembly 404. In FIG. 4, the bottom plane of the base 404 replaces surfaces 312B, 314B, 316B in FIG. 3, but the base 404 provides the same DOF constraints.

The slip-fit joint assemblies 300 and 400 in FIGS. 3 and 4 may be fabricated with the same manufacturing procedures described above and below with reference to FIGS. 31–33. For example, the lithography process and the micromachining process may fabricate the desired mating surfaces 306A–306C, 308A–308C, 310A–310C, 312A–312C, 314A–314C, 316A–316C of the male and female connectors. In some applications, it is desirable to include a metallization process after the substrate wafer is cleaned. A metal is deposited via sputtering onto the male (tabs) and female connectors (slots). The metallization process increases robustness and reduces debris formation at the mating surfaces of the male and female connectors.

In one embodiment, each element in an assembly is kinematically supported with respect to all other elements. If each connecting element (e.g., element 106 in FIG. 1A) is kinematically supported in addition to the base and payload, the DOFs controlled by the connecting elements are capable of more accurate positioning. Thus, there are no allowed trajectories of the connecting elements (degenerate support). An allowed trajectory (change of attitude) of a connecting element could disturb the desired DOF controlled by the connecting element. Also, there is no overconstraint (redundant support) that could warp the connecting elements. An overconstraint could change a controlled DOF position through applied strain. As a consequence of kinematic support, every structural element in an assembly can now be a "payload," which could support one or more optical components to the same levels of accuracy previously described.

In addition, an unlimited number of structural elements may be attached (to form a "daisy chain") in this manner to a high level of accuracy. Each successive payload may be the base for the next payload in the chain. Another valid topology is to have an unlimited number of payloads attached to one set of connecting elements using the same DOFs at each connecting element (see "megastack" in FIG. 25). Other topologies may be possible.

Figure 5:
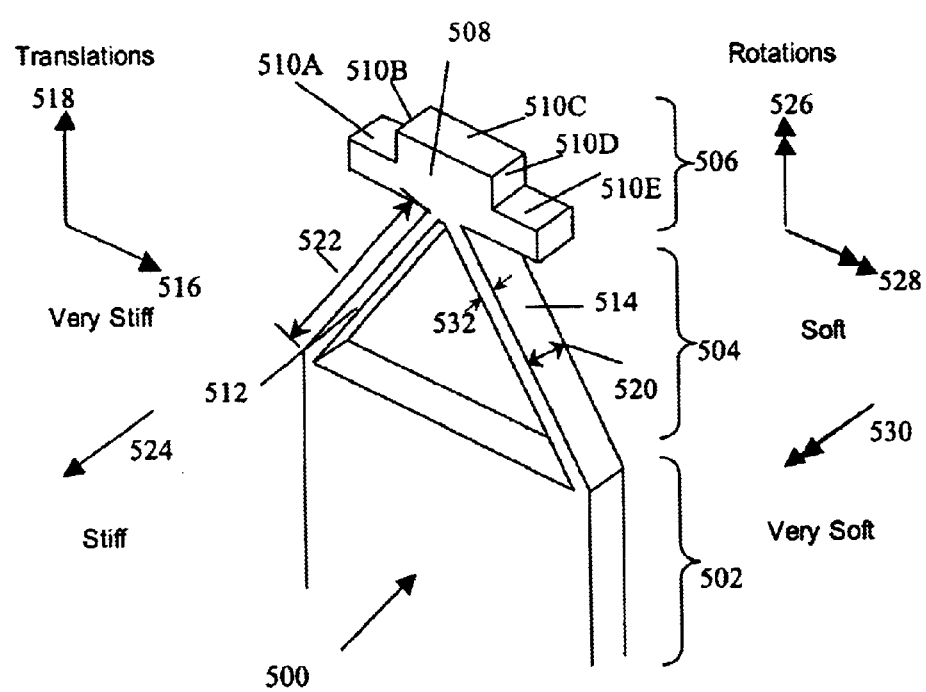
FIG. 5 is a three-dimensional view of one embodiment of a stiffness control flexure system and an attachment portion.

Pseudo-Kinematic Connecting Element, Flexure Systems, Ball Joints, Attachment Points FIG. 5 illustrates a three-dimensional view of one embodiment of a pseudo-kinematic connecting element flexure system and an attachment point 500. "Pseudo-kinematic" means that although there may be many DOFs connecting at least two bodies through a plurality of connecting elements, such as two micromachined passive alignment assemblies, in a practical attachment scheme, the DOFs can be tailored such that only six DOFs have relatively high stiffness, and substantially all other DOFs have relatively low stiffness. In some applications, it is desirable to have at least one DOF with low stiffness to be two to three orders of magnitude lower than a DOF with high stiffness. DOFs with different levels of stiffness may be accomplished using a flexure system, such as the flexure system 504 in FIG. 5, to relieve stiffness in unwanted DOFs. Hereinafter, "kinematic" may be used to refer to pseudo-kinematic attachments.

In FIG. 5, the pseudo-kinematic connecting element flexure system and attachment point 500 comprises a body 502, a flexure system 504, and an attachment portion 506. The flexure system 504 couples the body 502 to the attachment portion 506. The attachment portion 506 and the flexure system 504 may be collectively referred to herein as a "ball joint," a "ball joint flexure" or a "flexured ball joint" in a planar structure. A ball joint is a useful pseudo-kinematic structure that is relatively stiff in substantially all translations and relatively soft in substantially all rotations.

One embodiment of the attachment portion 506 in FIG. 5 comprises a mounting tab 508 with mating surfaces (contact surfaces) 510A, 510B, 510D, 510E, which may provide high precision dimensional control to mating elements. The flexure system 504 comprises two flexure elements 512, 514 that form a bipod-like structure. Each flexure element 512, 514 is very stiff in at least an axial direction. Thus, each flexure element 512, 514 provides a very stiff connection between the attachment portion 506 and the body 502 in DOFs 516 and 518, as shown in FIG. 5.

Depending on the cross-sectional properties of the flexure system, the connecting elements may have compliant (or "soft") rotations become stiff and tiff translations become soft. The cross-sectional properties of the flexure elements 512, 514 include blade depth 520, blade length 522, and blade thickness 532. If the blade depth 520 of the flexure elements 512, 514 is significantly smaller (e.g., less than 1/10) than the blade length 522, the attachment of the body 502 to the attachment portion 506 by the flexure elements 512, 514 may have two stiff DOFs 516, 518 (i.e., forming a bipod), and other relatively softer DOFs 524, 526, 528, 530.

In other applications, if the flexure elements 512 and 514 have a blade depth 520 that is significant (e.g., greater than about 1/10 of the blade length 522), then DOF 524 has significant stiffness, and the attachment has the properties of a ball joint. The rotational DOFs 526, 528 may become stiffer compared to DOF 530, which is primarily controlled by the flexure blade width 532. In one embodiment, DOFs 526, 528 are soft and DOF 530 is very soft compared to DOFs 516, 518. Depending on the exact magnitude and the sensitivity of a particular design, the soft DOFs 526, 528 may not cause any problems.

The stiffness of DOFs is highly dependent on the exact cross-sectional properties (blade depth 520, length 522, and thickness 532) of the flexure elements 512, 514. It would be relatively easy to make the "soft" rotational DOFs 526, 528 stiffer and make the "stiff" translation 524 softer by changing the cross-sectional properties. As long as the blade length 522 is much greater than the blade depth 520 and the blade thickness 532, e.g., 10 to 1 ratio (other ratios may be used), the "very stiff" translations 516 and 518 and the "very soft" rotation 530 will remain unchanged for this configuration.

In one configuration, it is desirable to have a ball joint at both ends of the body 502 to form a monopod connecting element (not shown). This configuration would create an appropriate set of stiff DOFs to make the monopod connecting element act like a single DOF constraint between two bodies.

Pseudo-Kinematic Bipod Connecting Element

Figure 6:
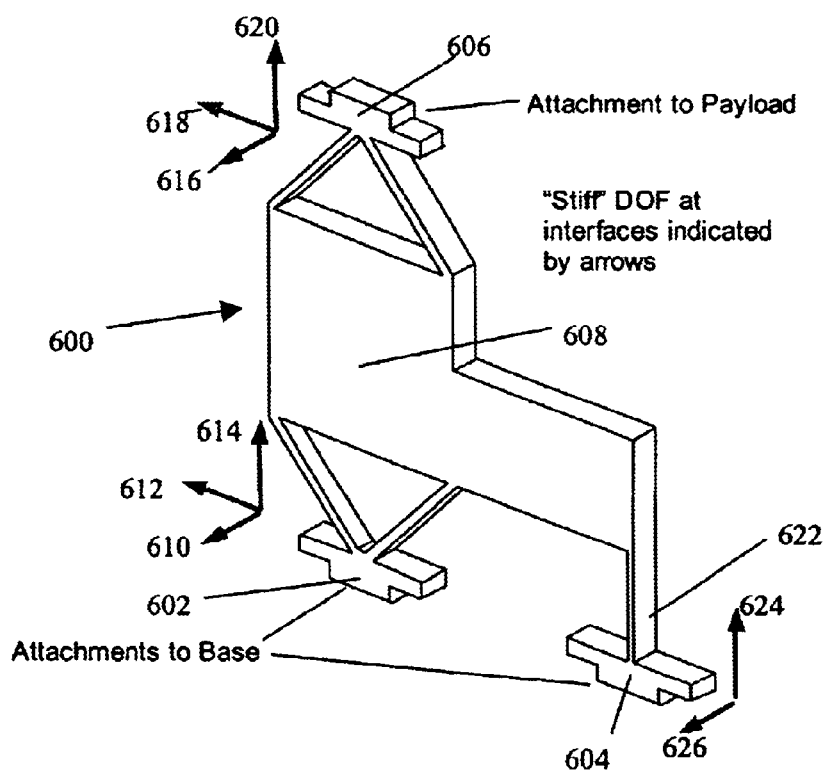
FIG. 6 is a three-dimensional view of one embodiment of a pseudo-kinematic bipod connecting element.

In another configuration, it is desirable to have three attachment portions, similar to the attachment portion 506, coupled to the body 502 to form a pseudo-kinematic bipod connecting element, as shown in FIG. 6.

FIG. 6 is a three-dimensional view of one embodiment of a pseudo-kinematic bipod (i.e., two-DOF support) connecting element 600. The pseudo-kinematic bipod connecting element 600 comprises attachment points 602, 604, 606 and a body 608. The two attachment points 602 and 604 of the connecting element 600, may connect to a base assembly (not shown). The attachment point 606 may connect to a (nominal) payload assembly (not shown).

Two of the attachment points 602 and 606 are coupled to the bipod body 608 via ball joint flexures, as described above with reference to FIG. 5. The ball joint at attachment point 602 provides three DOFs 610, 612, 614 of connectivity to the body 608. The ball joint at attachment point 606 provides three DOFs 616, 618, 620 of connectivity to the body 608. The attachment point 604 connects to the bipod body 608 via a single flexure 622 that provides two DOFs of connectivity 624 and 626.

In one embodiment, three bipod connecting elements, such as the element 600 in FIG. 6, are kinematic in their attachments to a base and a payload. The three bipod connecting elements also form a kinematic attachment between a base and a payload.

In FIG. 6, the pseudo-kinematic bipod connecting element 600 "borrows" several DOFs 610, 612, 614, 616, 624, 626 from the base assembly and the payload assembly to control the position and attitude of the bipod connecting element 600. This set of DOFs 610, 612, 614, 616, 624, 626 forms a 3-2-1 support structure (3 DOFs at one point, two DOFs at another, one DOF at a third) that is kinematic or pseudo-kinematic. Thus, the pseudo-kinematic bipod connecting element 600 could itself be an optical bench. The remaining DOFs 618 and 620 are used by the pseudo-kinematic bipod connecting element 600 to control the payload assembly.

The DOFs 610, 612, 614, 616, 618, 620, 624 and 626 may depend on one or more assumptions described above. For example, it may be assumed that the payload assembly is fully constrained by other pseudo-kinematic bipod connecting elements 600. Otherwise, the "borrowed" DOF 616 may not be constrained.

As another example, at each attachment point 602, 604, 606 connected to a base or payload, all six DOFs with the attached body may be constrained by an adhesive or a preload (discussed below) to seat the mating surfaces without a deadband. The flexure structures may then select a subset of these DOFs to connect (i.e., be stiff in) to the body 608 to create the kinematic condition.

The structures described herein may have high stiffness in certain DOFs and much lower stiffness in all other DOFs. Some DOFs may vary in a common fashion with changes in flexure system dimensions, possibly requiring that a design decision may be made between either (1) allowing extra stiff DOFs, where an attachment may no longer be pseudo-kinematic, or (2) allowing a desired stiff DOF to be soft, which leaves the assembly with a relatively low frequency vibration mode and any desired positional accuracy in that direction may be compromised. Each of the two choices may be a viable design. An extra stiff DOF means a redundant support, which may be undesirable for an optical bench connected to a poorly-controlled external structure, but may be acceptable for certain size scales or sets of assumptions. Low frequency vibration modes may be a problem, but if the low frequency is in the kilohertz range while the device operates in approximately the 100-Hertz range, there will not be a detrimental dynamic interaction.

The connecting elements 500 and 600 in FIGS. 5 and 6 may be fabricated with micromachining manufacturing methods described herein. For example, lithography and micromachining can fabricate the connecting elements 500 and 600 to the sub-micron level. To translate these highly accurate planar processes to highly accurate three-dimensional positioning accuracy requires the same DOF control used for kinematic attachment. In other words, the stiff constrained directions used to form a kinematic attachment (e.g., the directions constrained between a base and a payload by three bipod connecting elements) can also have a precisely-determined dimension associated with each of them, thereby uniquely and precisely specifying the position (translations) and attitude (rotations) between two bodies (e.g., a base and a payload). This precisely-determined dimension is shown in detail below in FIG. 7 for one bipod element.

Figure 7:
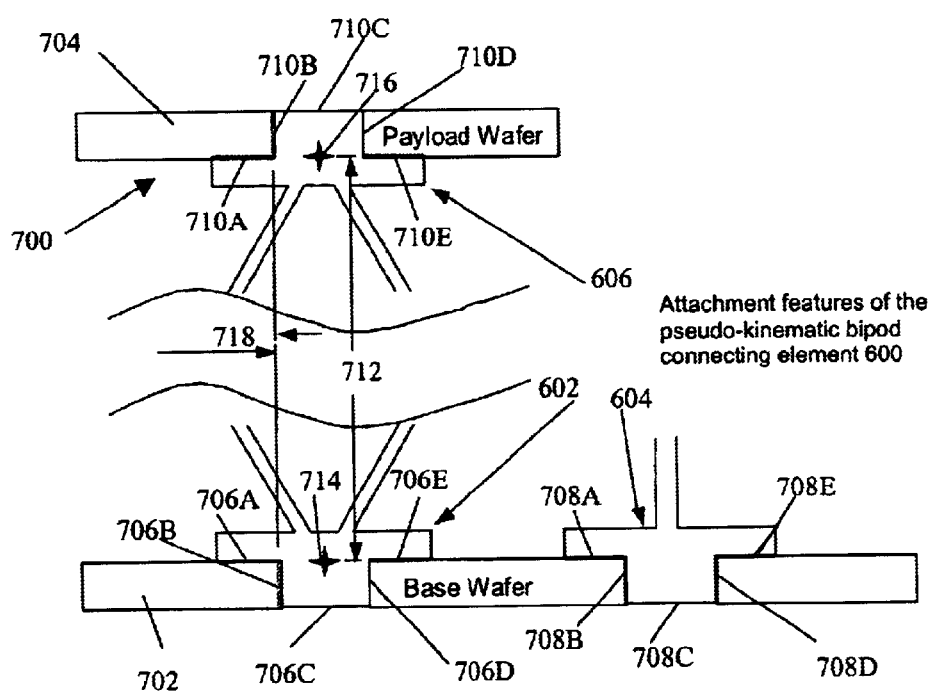
FIG. 7 illustrates an example of positional control using the pseudo-kinematic bipod connecting element in FIG. 6 attached to a base assembly and a payload assembly.

FIG. 7 illustrates an example of the pseudo-kinematic bipod connecting element 600 (alignment features on a planar object) in FIG. 6 attached to a base assembly 702 and a payload assembly 704. The attachment points 602, 604 and 606 engage into the base assembly 702 and the payload assembly 704 at the mating surfaces 706A, 706B, 706D, 706E, 708A, 708B, 708D, 708E and 710A, 710B, 710D, 710E, respectively. The bipod connecting element 600 has two constrained and precisely specified DOFs at the payload 704 (DOFs 618 and 620 in FIG. 6).

One alignment feature in FIG. 7 may be a precise separation distance 712 between the base assembly 702 and the payload assembly 704, which is defined by a midpoint 714 of a line formed by mating surfaces 706A and 706E of attachment point 602 and another midpoint 716 of a line formed by mating surfaces 710A and 710E of attachment point 606. This precise separation distance 712 precisely specifies the location of the payload assembly 704 relative to the base assembly 702 in the vertical direction (DOF 620 from FIG. 6) at the point of attachment between the connecting structure (600 from FIG. 6) and the payload assembly 704.

Another alignment feature may be the lateral (horizontal) distance 718 between the mating surfaces 706B and 7101B, which may be zero, as shown in FIG. 7. In one configuration, the mating surfaces 706B, 710B may be collinear. Thus, the mating surface 706B forms a straight line with the mating surface 710B. Each vertical mating surface 706B, 710B may set a lateral position reference between the attachment points 602, 606. This precisely specifies the location of the payload assembly 704 relative to the base assembly 702 in the horizontal direction (DOF 618 in FIG. 6) at the point of attachment between the connecting structure (600 in FIG. 6) and the payload assembly 704.

Another alignment feature may be a pair of collinear line segments (that are also mating surfaces) 708A, 708E that interface the base side 702, are remote from point 714 and are collinear with 706A, 706E. The line segments 708A, 708E constrain the rotation of the planar object 600 about a normal to the plane of FIG. 7. Note that attachment point 604 could also interface to the payload side 704, and the constraint would be identical. This rotational constraint may completely restrain the connecting element 600 in the desired DOFs. Otherwise, rotation in-plane of FIG. 7 would nullify the proper function of the vertical and horizontal position reference features described above.

In summary, the base and payload planes in FIG. 7 are parallel and separated by a specific distance 712. In this example, the sets of collinear line segments 706A, 706E, 710A, 710E that define the separation distance are also parallel, and the lateral position reference 718 is zero (collinear line segments 706B, 710B) between the two connected objects 702, 704.

Thus, the connecting element 600 in FIG. 6 not only supports a payload 704 relative to a base 702 in 2 DOFs 618, 620, but also precisely locates the payload 704 relative to a base 702 in these same DOFs. Hence, three of these structures 600 would not only provide kinematic attachment between a payload and a base, but also completely and precisely specify the location and orientation of the payload relative to the base.

The method of engaging attachment points 602, 604, 606 may be the same for the attachment portion 506 of the pseudo-kinematic connecting element 500 shown in FIG. 5 and described above.

The above described connecting structure also applies for the more general case of non-parallel base and payload plates.

Design/Fabrication Considerations

Since the alignment features of the connecting element 600 discussed above are all coplanar lines, a mask with the desired pattern can be made for the patterning process (e.g., lithography). The patterning process can locate alignment features with high precision in a substrate wafer plane immediately adjacent to the mask.

In some applications, it may be important to consider two design and fabrication points for connecting elements 500 (FIG. 5) and 600 (FIGS. 6 and 7). First, the mask sides or regions of a substrate wafer intended to form mating features should be substantially in contact with the mask sides of other elements for highest precision. For example, for highest precision, the mask sides in FIG. 7 should be the upper surface of the base assembly 702 and the lower surface of the payload assembly 704.

Second, a micromachining process may either etch (cut) through the substrate wafer in a perfectly perpendicular manner or with a draft (e.g., inward draft). Etching the substrate in a perfectly perpendicular manner is the ideal case. If drafting occurs, it is recommended to have an inward draft with acute angles measured from the mask plane to the etched sides of the substrate wafer. It may be important to ensure contact at the masked side of the substrate wafer. In one embodiment, the amount of draft should be as small as practical, such as just enough draft to ensure there is nothing beyond a perpendicular cut (outward draft; obtuse angle) within the error of the micromachining process. For example, in one configuration, the draft is half a degree.

As a result of inward drafts, some of the ideal line contacts, shown in FIG. 7 as mating surfaces 706B, 706D, 708B, 708D, 710B, and 710D, may be reduced to point contacts with very shallow angles. The mating surfaces 706A–E, 708A–E, and 710A–E for the base assembly 702, the payload assembly 704 and the connecting element 600 may all experience drafts. Thus, the mating surfaces 706B and 710B (which define lateral position reference line segments 718) may actually be contact points on the mask sides of the base assembly 704 and the payload assembly 706. Inward drafting may be acceptable because the two planes of two mating surfaces, which coincide at a point contact, form a very acute angle. Thus, if a load is applied, a substantial contact patch may be formed, and hence result in reasonable contact stresses.

Internal Load and Flexure Assembly

To obtain maximum accuracy, the mating features described herein may be preloaded together with an externally-applied load (e.g., to seat mating features during a bonding operation) or an internally-reacted set of loads. In the latter case, the preload may be permanently applied and bonding may not be necessary. Internally reacted loads may be created by deflecting a flexure assembly (see FIG. 8) that is micromachined into one or more of the connected planar structures.

Figure 8:
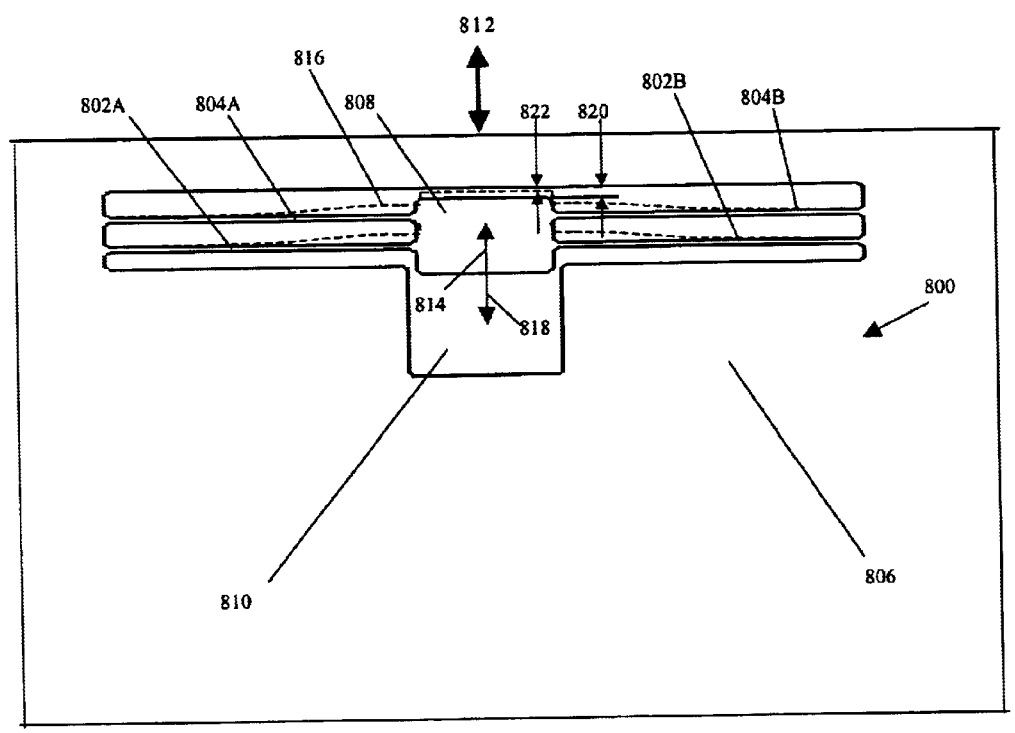
FIG. 8 is a side view of one embodiment of an internal flexure assembly.

FIG. 8 is a side view of one embodiment of an internal flexure assembly 800 (also referred to herein as an "internal preloader" or "preload"). The internal flexure assembly 800 comprises a set of double-parallel-motion flexures 802A–802B, 804A–802B (double-parallel-motion set) with outer ends connected to a wafer 806. In one embodiment, the internal flexure assembly 800 may further comprise a preloader stage 808 connected to the inner ends of the flexures 802A–802B and 804A–802B. The stage 808 constitutes a linear motion control device and hence may be called a "stage." In one embodiment, it is desirable to have a hole 810 on at least one side of the preloader stage 808 for inserting a preloader pin (see FIG. 10).

In some applications, it is desirable to use the internal flexure assembly 800 to provide internal preloading in a substrate wafer, thereby seating mating surfaces together without a deadband. Internal preloading occurs when the flexures 802A–802B, 804A–804B are deflected by the action of inserting a preloader pin, or more generally a mating feature of another planar structure.

Each flexure 802A–802B and 804A–804B constrains DOFs such that the preloader stage 808 is supported very stiffly in five DOFs, but is soft in the one remaining DOF 812 (i.e., forming a spring). This soft DOF 812 is in the direction where the preload is applied. An applied deflection 816 results from a force 814 applied at the preloader stage 808. The force 818 is equal to and opposite to a resultant force 814 (internally reacted force) applied by the preloader stage 808 to the connected wafer 806 in the vertical direction in FIG. 8. The force 818 is the preload force used to positively seat a mating element against reference features (see FIGS. 9 and 11). In one embodiment, a relatively large deflection 816 is required to generate a preload 818.

The internal flexure assembly 800 in the planar structure of FIG. 8 may be micromachined with high accuracy. Thus, the flexures 802A–802B, 804A–802B may have highly-accurate stiffnesses. Thus, deflections 816 of the flexures 802A–802B, 804A–802B should generate very accurate, repeatable and/or predictable preloads from device to device. By internally reacting these accurately-defined preloads, negligible distortion may occur in mated structures.

A maximum deflection capability defined by a "deflection stop" 820 may be implemented to limit the motion of the preloader stage 808. If the applied deflection 816 is close to the deflection stop 820, then motions of an assembled structure (because of further elastic deflection of the preloader stage 808 due to inertial or external loads on the assembly) will be limited to the difference in height 822 between the applied deflection 816 and the maximum deflection 820.

Tab and Slot

In some configurations, it is desirable to attach micromachined passive alignment assemblies using male and female connectors, such as by way of example, a tab and slot attachment scheme.

Figure 9:
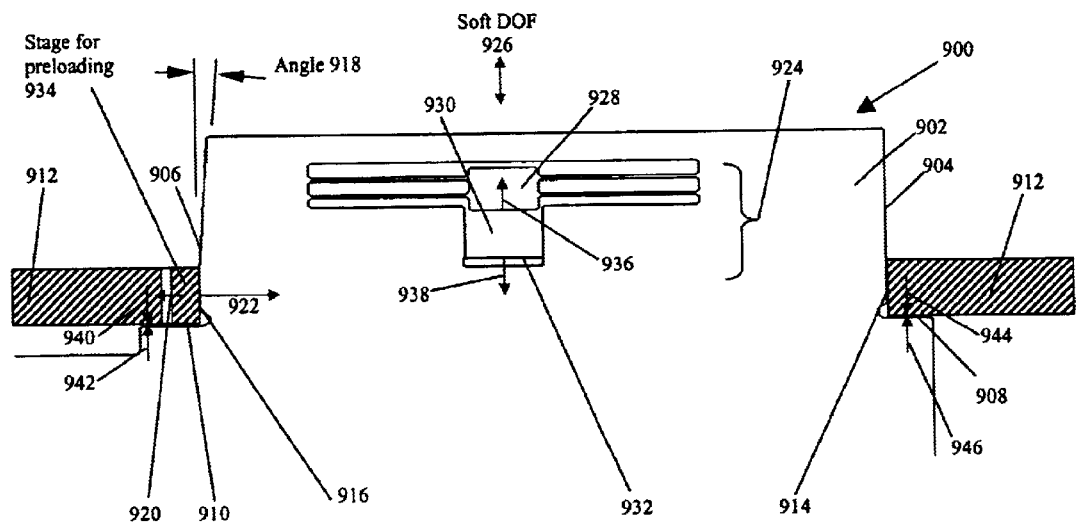
FIG. 9 illustrates two examples of preloading using a tab and slot attachment scheme with the internal flexure assembly of FIG. 8.

FIG. 9 illustrates two examples of preloading using a tab and slot attachment scheme with the internal flexure assembly 800 of FIG. 8. The tab 902 may be used as an attachment point for a connecting element, or a male or female connector for a base or payload assembly. The tab 902 has two substantially vertical mating surfaces 904 and 906, and two horizontal mating surfaces 908 and 910.

In FIG. 9, a connecting object 912 (such as a horizontal wafer) has an opening or slot for inserting the tab 902 (FIG. 9 is a section view along the long axis of the slot, normal to the plane of object 912, and in the plane of the tab 902). The connecting object 912 may have mating surfaces such as surfaces 914, 916 that serve as counterparts to the mating surfaces 904, 906 of the tab 902. When the tab 902 is inserted into the slot, the vertical mating surfaces 904, 906 (horizontal constraint features) of the tab 902 rest against the ends 914, 916 of the slot in the connecting object 912, and the horizontal mating surfaces 908, 910 (vertical constraint features) of tab 902 rest against the lower surface of object 912.

In one example of preloading, if a lateral position/motion constraint is desired, one substantially vertical mating surface 904 of the tab 902 is made to bear against one end 914 of the slot. The other end 916 of the slot comprises a stage for a flexure preloader 934. The substantially vertical mating surface 906 of the tab 902 may be formed at an angle 918 (angle relief) to enable initial vertical engagement against the end 916 of the slot. When the tab 902 is fully seated in the vertical direction in the slot of the connecting object 912, the preloader stage 934 is displaced laterally (to the left, as indicated by an arrow 920) a sufficient amount to generate a desired load 922 (to the right) against the mating surface 906 of the tab 902.

Another example of preloading in FIG. 9 involves the internal flexure assembly 924 (also called a flexure preloader) in the tab 902 as a vertical position/motion constraint. The internal flexure assembly 924 is micromachined into the tab 902 with a soft DOF 926 of the preloader stage 928 in the vertical direction. When the tab 902 is approximately seated vertically (i.e. surfaces 908 and 910 in approximate contact with connecting object 912), there is a hole 930 whose top edge is the preloader stage 928 and whose bottom edge and sides are in the tab 902.

In one embodiment, the bottom edge of the hole 930 is a horizontal surface of a part 932 of the connecting object 912 (wafer). The shape of the hole 930 may be rectangular, circular, polygon or other shape, depending on the design of the micromachined passive alignment assembly. A separate structure called a preloader pin (see FIG. 10) may be inserted in the hole 930 in FIG. 9 to generate a vertical preload force pair 936, 938 (via upward displacement of the stage 928). The force 936 acts on the tab 902 and force 938 acts on the part 932 of connecting object 912 that forms the bottom of hole 930. These forces 936, 938 are then reacted across the horizontal mating surfaces 908, 910 and the lower surface of object 912 by force pairs 940, 942 and 944, 946, which forces these surfaces into intimate contact and creates a more precise (i.e. deadband free) vertical position constraint. At this point, in the absence of any flexured "ball joint" type structure attached to tab element 902, a vertical constraint on the paired surfaces 908 and 910 also creates a (possibly redundant) rotational constraint out of the plane of FIG. 9. This may be acceptable (see sections "Redundant Elements for Additional Stiffness / Planarity Enforcement" and "Optical Element Support Structure").

Figure 10:
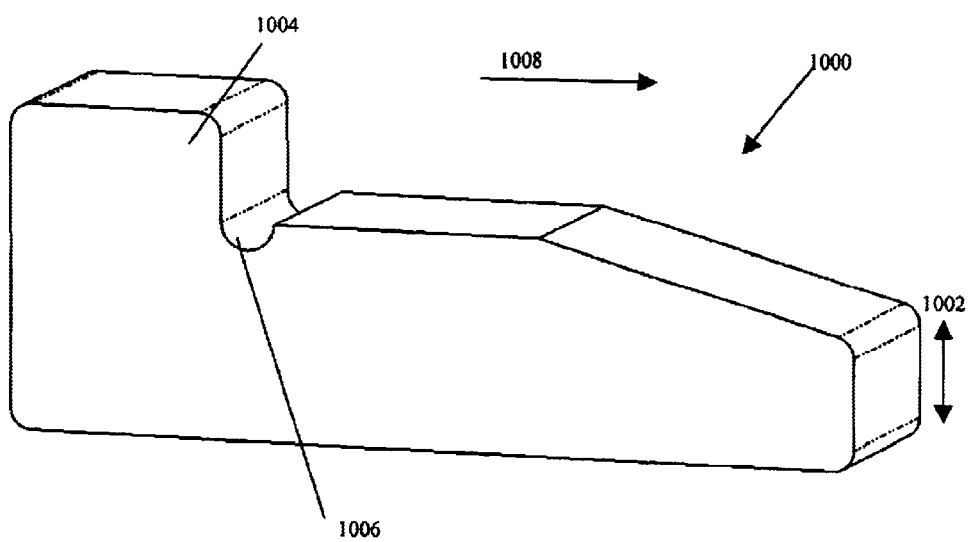
FIG. 10 is a three-dimensional view of one embodiment of a preloader pin.

FIG. 10 is a three-dimensional view of one embodiment of a preloader pin 1000. The preloader pin 1000 may be fabricated using patterning and micromachining processes discussed herein. The preloader pin 1000 may be made of silicon, plastic or some other suitable substance. The cross-section of the preloader pin 1000 may be a rectangle, a circle, a square, a polygon or some other suitable shape. In one embodiment, the end of the preloader pin 1000 has a substantially square cross-section with four sides that are preferably about 500 microns in length. The shape of the right cross-section end of the preloader pin 1000 is configurable and may depend on the shape of the hole 930 in FIG. 9, such that when the preloader pin 1000 is fully inserted in the hole 930, the preloader stage 928 is deflected vertically a desired amount.

Gently tapering the preloader pin 1000 in the vertical direction 1002 allows a low-force initial insertion and engagement. In some applications, the preloader pin 1000 is maintained in the hole 930 (FIG. 9) by friction. The frictional holding should be good to several hundred times gravitational acceleration. In other applications, it may be desirable to dispense an adhesive (e.g., spot of glue) on the preloader pin 1000 to restrain the pin 1000 in the hole 930.

In FIG. 10, the preloader pin 1000 may comprise a stop flange 1004 to provide a positive stop location after inserting the preloader pin 1000 in the direction of insertion 1008. The preloader pin 1000 may also comprise an edge relief 1006 to allow for any sharp corners of the mating surfaces in the preloader stage 928 (FIG. 9) or hole 930.

In FIG. 9, the flexure preloader 934 and the other flexure preloader (internal flexure assembly 924) each form an internally-reacted set of loads. In the first example described above, the force reaction points are the two substantially vertical mating surfaces 904 and 906 of the tab 902 and the two ends 914 and 916 of the slot, where one end 916 comprises a stage of a flexure preloader 934. The preload 920 causes simple compressive stress locally in the tab 902, and a somewhat more complex yet still local tensile stress pattern around the slot. By virtue of the softness of the preloader 934, the forces and hence stresses can be made very small in absolute value. Since strain is proportional to stress, and overall distortion is proportional to strain times a distance, small localized strains create negligible overall distortions.

Figure 11:
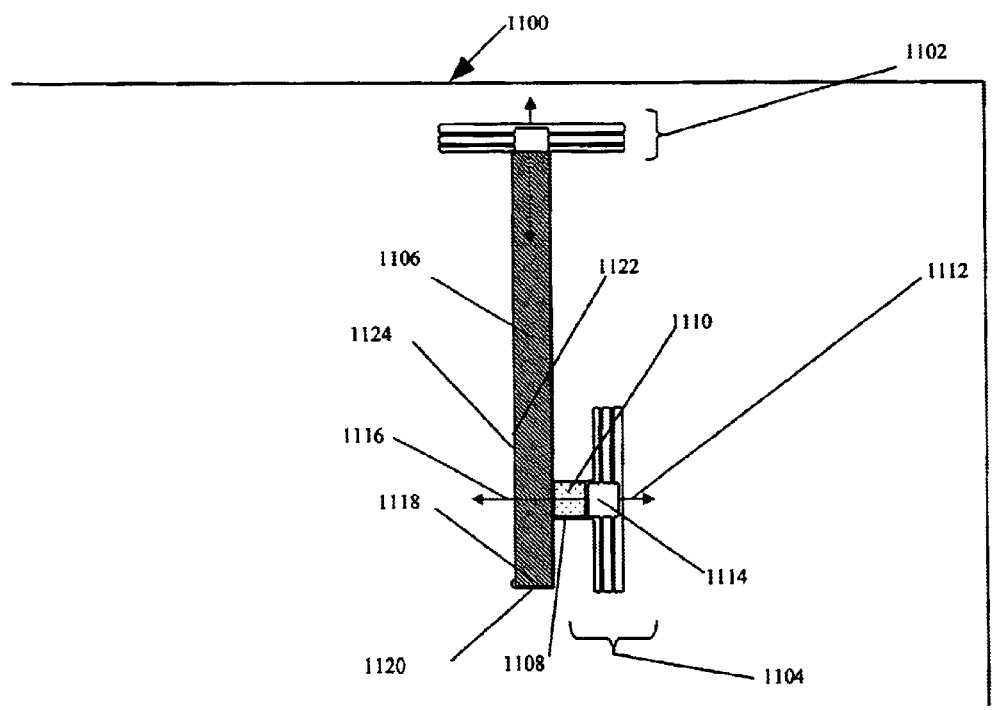
FIG. 11 illustrates an example where a plurality of internal flexure assemblies are used to maintain contact at mating surfaces of a slot.

FIG. 11 illustrates an assembly 1100 where two internal flexure assemblies 1102 and 1104 are used to maintain the 2-DOF, in-plane position of a tab 1106, i.e., maintain contact at mating surfaces of a slot. The tab 1106 in FIG. 11 may represent a top view of the tab 902 in FIG. 9, and a planar object 1100 in FIG. 11 may represent a top view of the connecting object 912 in FIG. 9. As in FIG. 9, the tab 1106 in FIG. 11 fits in a slot in the object 1100. Thus, an internal flexure assembly 1102 in FIG. 11 may represent the flexure preloader 934 described above in the first preloading example of FIG. 9. The internal flexure assembly 1102 in FIG. 11 controls the vertical position of the tab 1106 in FIG. 11 by preloading surface 1118 of tab 1106 against surface 1120 of planar object 1100. These surfaces are analogous to 904 and 914, respectively, in FIG. 9.

The other internal flexure assembly 1104 in FIG. 11 controls the horizontal position of the tab 1106. The internal flexure assembly 1104 has a hole 1108 configure to receive a preloader pin 1110. FIG. 11 shows an end view of the preloader pin 1000 in FIG. 10. When a preloader pin 1110 is inserted into the hole 1108, the pin 1110 causes a horizontal deflection 1112 (to the right) of a preloader stage 1114, which causes a horizontal force 1116 (substantially equal and opposite to the deflection 1112) applied by the preloader stage 1114 on the pin 1110 and the tab 1106. This forces surface 1122 of tab 1106 into intimate contact with surface 1124 of planar object 1100.

Partially-Degenerate, Partially-Redundant, Pseudo-Kinematic Designs

The level of stiffness or softness of a particular DOF depends on design factors such as plate stiffness of an attached structure, a desired precision of position, thermal and dynamic environment, etc. An alignment assembly may be designed to be partially-degenerate, partially-redundant or a pseudo-kinematic design with substantially six stiff DOFs.

To construct a partially-degenerate support, design analysis determines resonant modeshapes and frequencies and verifies that the modeshapes and frequencies do not negatively impact the design.

For a partially redundant support, an appropriate analysis involves application of dynamic and thermal environments to verify that distortions caused by the dynamic and thermal environments are less than the desired precision.

For many applications of these micromachined pseudo-kinematic structures, there may be two things in common: (1) all component structures may be made of silicon and (2) the payload and the base may be parallel. Where either of these conditions occur, it is possible to greatly relax the constraints of kinematicity. If a structure is all silicon, a highly redundant support system can be used. If redundant DOFs are properly chosen, the payload may only experience warping in the presence of high thermal gradients, which is unlikely given the high conductivity of silicon and the small dimensions involved. If a symmetric support is used and the base and payload are parallel, bulk temperature changes would cause only a piston shift (no lateral, tip, tilt, or roll shift).

The design and fabrication combination of solid modeling software and lithographic micromachining allows the construction of multi-part assemblies where the fit-up on assembly may be virtually perfect, even with complex geometries. The construction of multi-part assemblies where the fit-up on assembly may be virtually perfect may obviate the need for kinematic attachment in many cases. In the macroscopic world, much of the need for kinematic support is due to imperfections of the mounting surfaces.

An added benefit of a redundant support is greater stiffness of each of the component parts of the assembly. Extended line contacts effectively restrain out-of-plane deformations in a wafer.

Fiber Termination Array Assembly

Figure 12A:
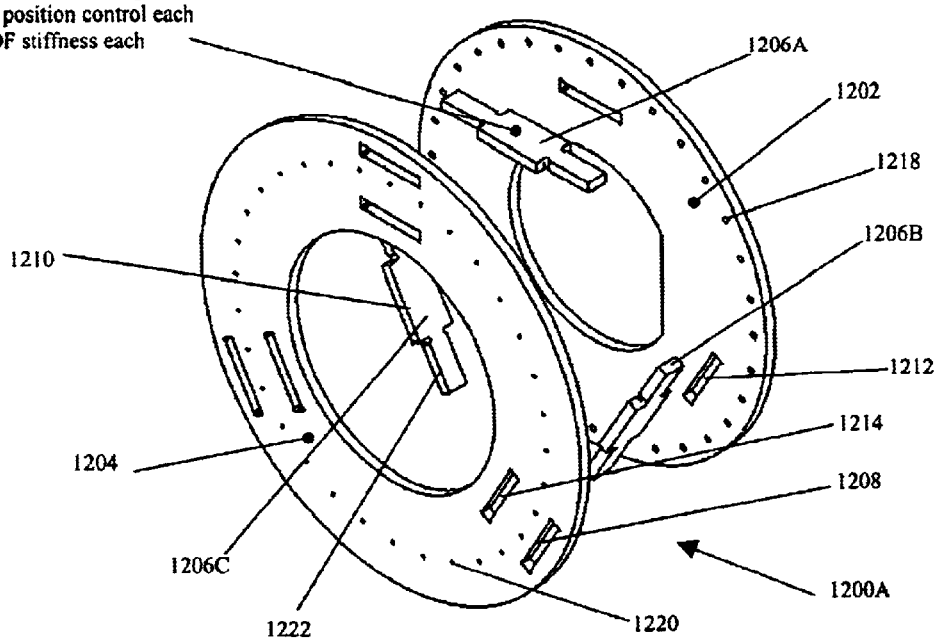
FIG. 12A is a three-dimensional enlarged view of one embodiment of a fiber termination array assembly.
Figure 12B:
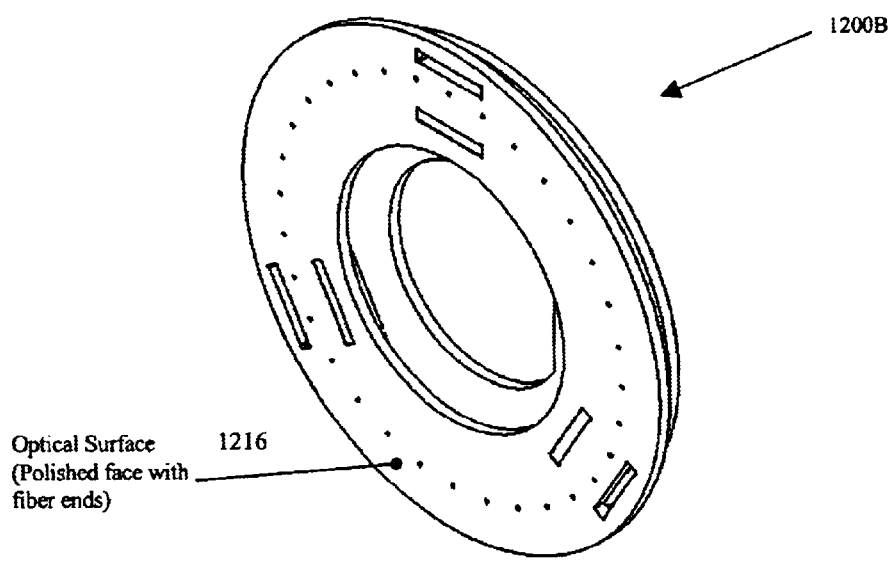
FIG. 12B is a three-dimensional assembled view of the fiber termination array assembly in FIG. 12A.

FIG. 12A is a three-dimensional enlarged view of one embodiment of a fiber termination array assembly 1200 (also called a fiber alignment device). FIG. 12B is a three-dimensional assembled view of the fiber termination array assembly 1200 in FIG. 12A. The fiber termination array assembly 1200 may be formed by one or more processes described in co-assigned U.S. patent application Ser. No. 09/855,305, entitled "ANGLED FIBER TERMINATION AND METHODS OF MAKING THE SAME", which is hereby incorporated by reference in its entirety. The fiber termination array assembly 1200 comprises a fiber locator plate 1202, a fiber termination plate 1204 and three connecting elements 1206A–1206C.

The fiber termination plate 1204 has a polished optical surface 1216, holes 1220 configured to support/align optical fiber ends and kinematic positioning slots 1208, 1214 (with mating surfaces). The slots 1208, 1214 are configured to receive a tab (with mating surfaces), such as tab 1210, of the connecting elements 1206A–1206C. The fiber locator plate 1202 also has holes 1218 configured to support/align optical fibers and slots, such as slot 1212, configured to receive a tab of the connecting elements 1206A–1206C. In one configuration, the connecting element protrusions 1222 form extended line contacts that effectively restrain out-of-plane deformations in the fiber termination plate 1204 and/or the fiber locator plate 1202.

The three connecting elements 1206A–1206C constrain the fiber termination plate 1204 to the fiber locator plate 1206 with about six DOFs. Each connecting element 1206 may control two DOFs of position and may have four to five DOFs of stiffness. Although one connecting element 1206A may be redundant in a stiffness DOF in view of the other connecting elements 1206B, 1206C, each connecting element controls two DOFs of position and may precisely position the fiber locator plate 1202 with respect to the fiber termination plate 1204.

In some applications, it may be desirable to connect the fiber termination plate 1204 and the fiber locator plate 1202 with more than six stiff DOFs. For example, more than six stiff DOFs are used to reinforce flatness, add stiffness, and prevent sagging under gravity or vibration for the fiber termination plate 1204 and the fiber locator plate 1202.

In one embodiment, the assembly 1200 was analyzed for polishing pressure on an optical face on the fiber termination plate 1204 and found to have deformations on the nanometer level with typical polishing pressures.

As shown in FIGS. 12A and 12B, two objects, such as two planar silicon wafers, may be positioned precisely relative to each other in six DOFs (tip, tilt, piston, roll, and two in-plane DOFs (lateral to separation direction)) to lithographic levels of precision or exactness. The two objects may be positioned by using planar connecting structures, each with mating reference features to control one or more DOFs between the two objects for a total of six DOFs. The objects and connecting structures may all be fabricated using lithographic micromachining techniques, or their equivalents in precision. The two objects to be aligned may contain arrays of optical components, which are already precisely positioned within the plane such that the two arrays would be precisely positioned relative to each other.

If the above positioning concept has no internal preloading, some gaps are allowed between mating features to ensure assembly. These gaps may contribute to the overall error in the positions of objects in the assembly.

If the above positioning concept has internal preloading, internally reacted loads ensure contact between mating surfaces, remove any gaps and allow a very high assembly precision.

Redundant Elements for Additional Stiffness / Planarity Enforcement

Large pseudo-kinematically supported planar arrays may be designed with extra bending stiffness to resist inertial loads. To implement extra bending stiffness, redundantly-attached ribs may be added to a main wafer plane. The redundantly attached ribs may be designed to actually enforce the flatness of the main wafer. This enforcement may be done to lithographic precision.

Figure 13:
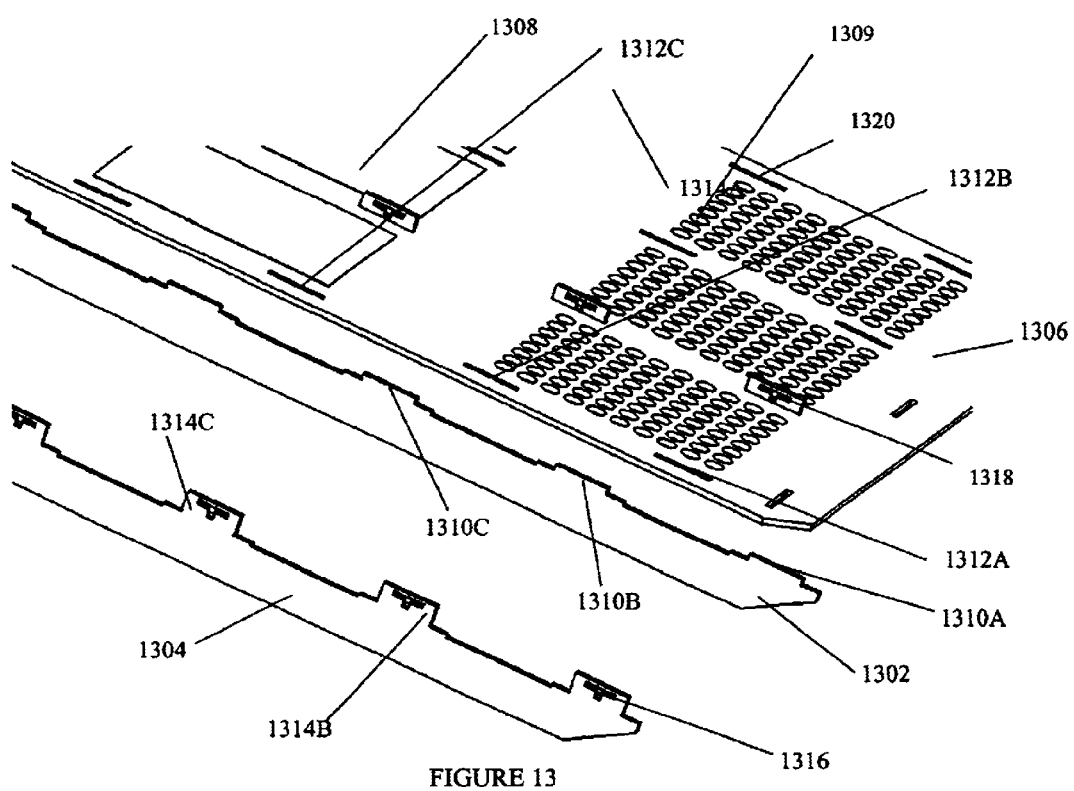
FIG. 13 is a side view of two embodiments of redundant connecting elements.

FIG. 13 is a side view of two embodiments of redundant connecting elements 1302 (also called ribs) and 1304 and a plate 1306 (also called wafer). The wafer 1306 may be used as an optical bench to support optical elements 1308, 1309 such as fibers, lenses or mirrors. In one embodiment, a wafer 1306 (e.g., a base assembly or a payload assembly) is supported with more than six stiff DOFs to enforce flatness (i.e., planar surface control), add extra stiffness, resist inertial loads (e.g., sagging or bending under gravity or vibration of the wafer 1306), and/or resist externally-applied loads from the environment. Thus, less strains or distortions are communicated to the optical elements 1308 and their positions remain more precise.

The connecting elements 1302 and 1304 may be designed with redundant tabs 1310A–1310C, 1314A–1314C (also called attachment points). The connecting elements 1302 and 1304 may be fabricated with high precision using the patterning and micromachining processes discussed above.

In one embodiment, the connecting element 1302 has tabs 1310A–1310C that may engage into slots 1312A–1312C of the wafer 1306. The attachment mechanism of the tabs 1310A–1310C and slots 1312A–1312C may encompass external preloading and gluing of the tab into the slot. FIG. 13 shows a tab 1320 of a connecting element, such as connecting element 1302, that is flush with the top surface of the wafer 1306.

In another embodiment, the connecting element 1304 has tabs 1314A–1314C with internal flexure assemblies 1316 (with preloaders), which are micromachined in the tabs 1314A–1314C. The attachment mechanism of the tabs 1314A–1314C and slots 1312A–1312C may follow the second example described above with reference to FIG 9. FIG. 13 shows a tab 1318 of a connecting element, such as connecting element 1304, protruding from a top surface of the wafer 1306. Each tab 1318 may use a connecting pin (not shown).

Figure 14:
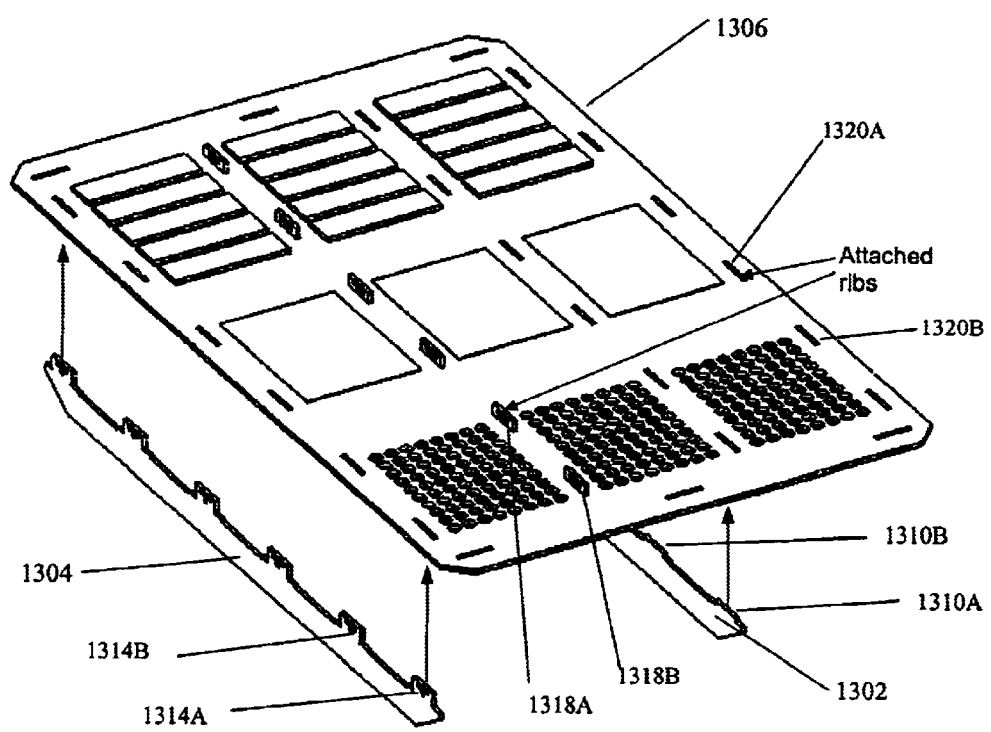
FIG. 14 is a three-dimensional view of the two redundant connecting elements and the plate of FIG. 13.

FIG. 14 is a three-dimensional view of the two connecting elements 1302 and 1304 and the plate 1306 of FIG. 13. FIG. 14 shows protruding, attached tabs 1318A, 1318B and attached tabs 1320 that are flush with the top surface of the wafer 1306. The tabs 1318A, 1318B, 1320 are part of connecting elements underneath the plate 1306. Each connecting element 1302, 1304 may have any number of tabs, such as six tabs, as shown in FIG. 14.

Pseudo-Kinematic vs. Partially-Degenerate Support

Figure 15:
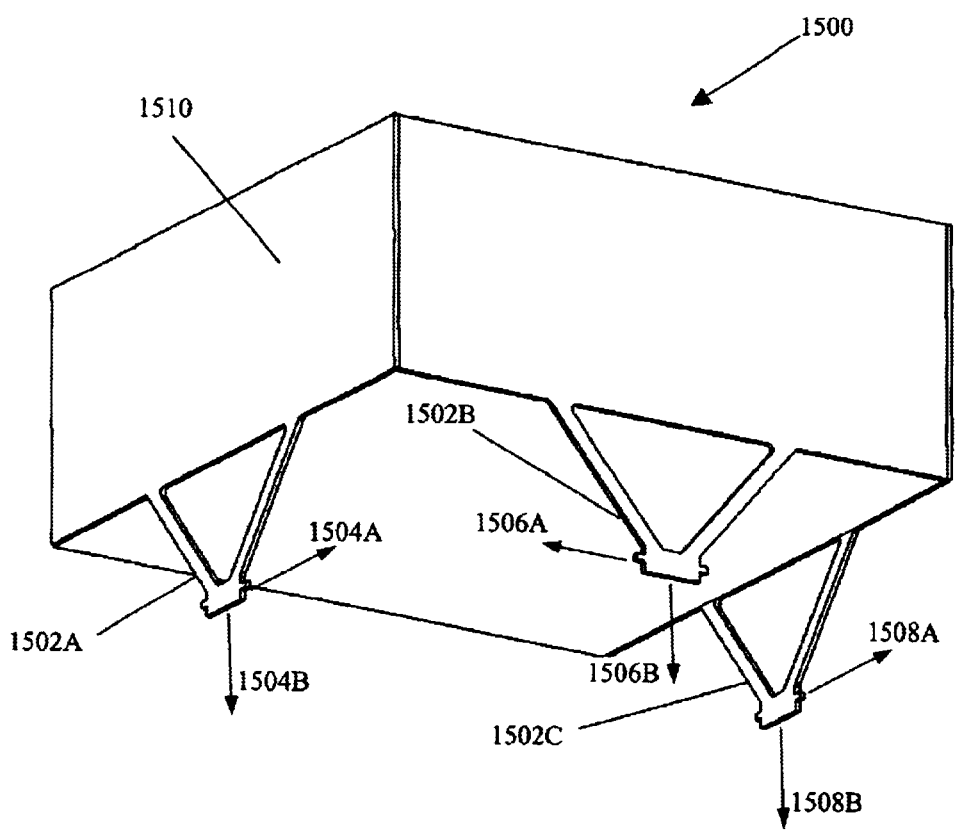
FIG. 15 is a three-dimensional view of one embodiment of a pseudo-kinematic support system.
Figure 16:
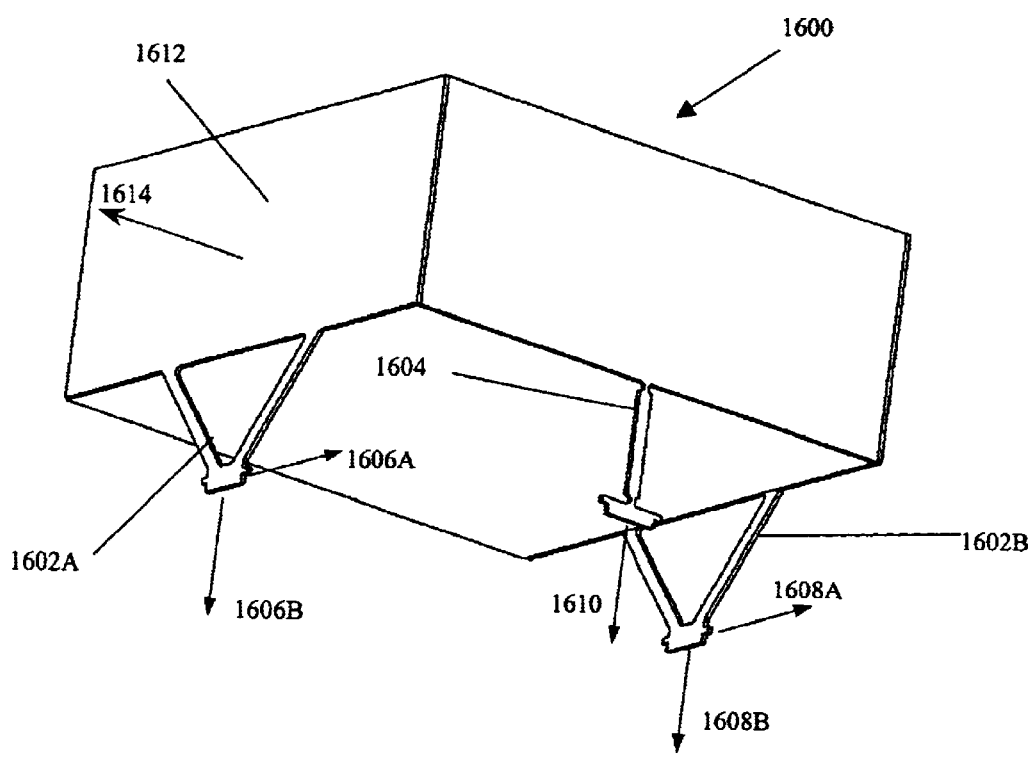
FIG. 16 is a three-dimensional view of one embodiment of a partially-degenerate support system.
Figure 17:
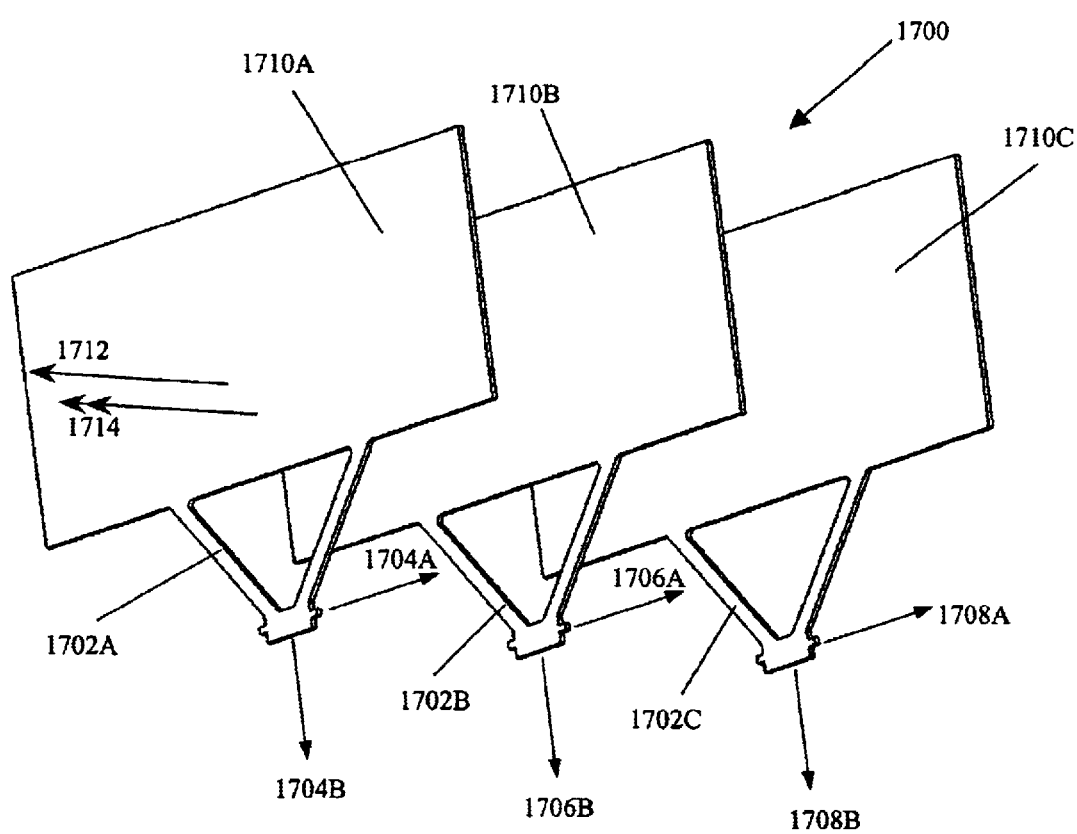
FIG. 17 is a three-dimensional view of another embodiment of a partially-degenerate support system.

FIGS. 15, 16 and 17 illustrate the difference between a pseudo-kinematic support system and partially-degenerate support systems. FIG. 15 is a three-dimensional view of one embodiment of a pseudo-kinematic support system 1500. The pseudo-kinematic support system 1500 in FIG. 15 comprises a box-like structure 1510 and three pseudo-kinematic, planar, bipod connecting elements 1502A–502C (referred to as "bipod connecting elements"). Each bipod connecting element 1502 may have two stiff or very stiff DOFs. For example, bipod connecting element 1502A has two stiff DOFs 1504A–1504B. Bipod connecting element 1502B has two stiff DOFs 1506A–1506B. Bipod connecting element 1502C has two stiff DOFs 1508A–1508B. Thus, the bipod connecting elements 1502A–1502C may constitute a complete support (six stiff DOFs) for the box-like structure 1510 (e.g., base assembly or payload assembly). The remaining DOFs (not shown in FIG. 15) may be soft. To determine whether or not a set of support DOFs is kinematic, redundant, or degenerate, the directions and points of application of each set of support DOFs should be considered. Kinematic may also be referred to as "determinate" or "statistically determinate." Redundant may also be referred to as "indeterminate" or "statistically indeterminate."

In some applications, it is desirable to have a degenerate support system, for example, when building a motion control stage. A degenerate support system constrains base and payload assemblies with less than six DOFs. As a result, there may be some trajectory (i.e. combination of Cartesian DOFs) of the payload assembly relative to the base assembly that is unconstrained. A degenerate support system may occur when a connecting element is missing or when certain connecting elements are parallel.

Although a degenerate support and a partially-degenerate support constrain base and payload assemblies with less than six DOFs, a degenerate support will move in some trajectory direction that is unconstrained while a partially-degenerate support will move in some trajectory direction that is resisted by soft DOF(s) from the pseudo-kinematic connecting elements. The trajectory direction of the degenerate support would have no restoring force and zero resonant frequency. Meanwhile, the trajectory direction of the partially-degenerate support would have relatively little restoring force, and a relatively low resonant frequency.

FIG. 16 is a three-dimensional view of one embodiment of a partially-degenerate support system 1600. The partially-degenerate support system 1600 in FIG. 16 comprises a box-like structure 1612, two pseudo-kinematic, planar, bipod connecting elements 1602A–1602B (referred to as "bipod connecting elements") and one pseudo-kinematic, planar, monopod connecting element 1604 (referred to as "monopod connecting element"). While the two bipod connecting elements 1602A–1602B each have two stiff DOFs 1606A–1606B, 1608A–1608B, the monopod connecting element 1604 has one stiff DOF 1610. Because the bipod connecting elements 1602A–1602B and the monopod connecting element 1604 are pseudo-kinematic, the remaining DOFs (not shown) may be soft.

Since the partially-degenerate support system 1600 restrains the structure 1612 with five stiff DOFs 1606A–1606B, 1608A–1608B, and 1610, there may be some trajectory direction 1614 for the structure 1612. Motion in this trajectory (motion direction) 1614 is resisted by out-of-plane bending of the bipod connecting elements 1602A–1602B and in-plane or out-of-plane bending of the monopod connecting element 1604, which are all fairly soft DOFs. Motion along trajectory direction 1614 would therefore have little restoring force, and thus would have a low resonant frequency. The compliance in trajectory direction 1614 would also mean any precise positioning features designed to control motion along the trajectory direction 1614 may have degraded performance.

FIG. 17 is a three-dimensional view of another embodiment of a partially-degenerate support system 1700. The partially-degenerate support system 1700 comprises three connecting plates 1710A–1710C and three pseudo-kinematic, planar, bipod connecting elements 1702A–1702C (referred to as "bipod connecting elements 702A–1702C"). Each bipod connecting element 1702A–1702C has two stiff or very stiff DOFs. For example, bipod connecting element 1702A has two stiff DOFs 704A–1704B. Bipod connecting element 1702B has two stiff DOF 1706A–1706B. Bipod connecting element 1702C has two stiff DOF 1708A–1708B.

In one embodiment, where the three plates 1710A–1710C are rigidly attached to each other, the system 1700 has a total of six stiff DOFs 1704A–1704B, 1706A–1706B, 1708A–1708B. The remaining DOFs (not shown) may be soft.

Because the attachment points of the three bipod connecting elements 1702A–1702C are collinear, one bipod connecting element 1702A may be ineffective. Thus, the three connecting plates 1710A–1710C with three bipod connecting elements 1702–1702C may have only four stiff DOFs, including two trajectory directions 1712 and 1714 with very low stiffness.

Strain Isolation

As explained above, one or more internal flexure assemblies may seat mating surfaces together without a deadband. One or more internal flexure assemblies may also be used to resist load-induced or temperature-induced strains/distortions in a base assembly from transferring to a payload assembly, or vice versa. At most, there may be a position shift and/or an attitude shift of the base assembly with respect to a payload assembly, or vice versa.

Figure 18:
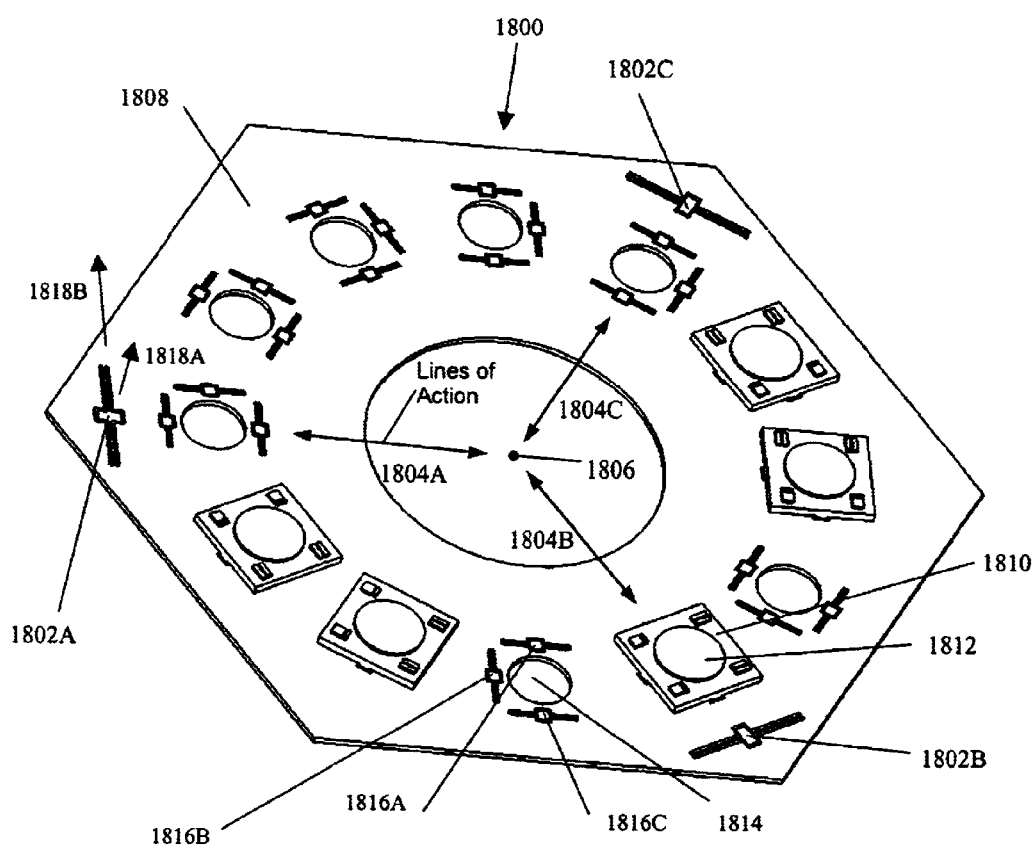
FIG. 18 is a three-dimensional view of one embodiment of a strain isolation flexure assembly.

FIG. 18 is a three-dimensional view of one embodiment of a strain isolation flexure assembly 1800. The strain isolation flexure assembly 1800 in FIG. 18 comprises one or more payload assemblies 1810 and a base assembly 1808 with micromachined features, such as three micromachined outer internal flexure assemblies 1802A–1802C (i.e., "strain-isolation mounting flexures" or "mounting flexures"), a plurality of holes 1814 and a set of inner internal flexure assemblies 1816A–1816C around each hole 1814.

The outer internal flexure assemblies 1802A–1802C in FIG. 18 may be oriented 120 degrees apart, as shown in FIG. 18, or oriented at any arbitrary angle or distance from each other, preferably with the lines-of-action 1804A–1804C (i.e., soft direction of the flexure system) meeting at some common point, such as point 1806. In some applications, it may be desirable to have less than three or more than three outer internal flexure assemblies in the strain isolation flexure assembly 1800.

Each outer internal flexure assembly 1802 controls two DOFs, such as DOF 1818A (vertical, out-of-plane) and DOF 1818B (in-plane). FIG. 18 illustrates three lines of action 1804A–1804C that intersect at a centroid 1806. The three lines of action 1804A–1804C represent degrees of flexibility or soft DOFs provided by the outer internal flexure assemblies 1802A–1802C.

Any distortion or strain in a foundation (not shown), to which the base assembly 1808 is attached via flexure assemblies 1802A–1802C, can be accommodated by motion along the lines of action, thereby generating only minute forces in the base assembly 1808 from restoring forces in the flexure systems 1802A–1802C. Thus, the outer internal flexure assemblies 1802A–1802C may prevent load-induced strains/distortions in a foundation from communicating to the base assembly to 1808, and hence maintain the relative location of one or more payload assemblies 1810, which are attached to the base assembly 1808. Thus, the flexure assemblies 1802–180C may be called "strain isolation mounting flexures." At most, there may be a position shift and/or an attitude shift of the base assembly 1808 with respect to the foundation, or vice versa.

The outer internal flexure assemblies 1802A–1802C maintain a pseudo-kinematic state between the base assembly 1808 and the foundation. The pseudo-kinematic state may be particularly important when the base assembly 1808 is used as an optical bench to support payload assemblies 1810. Maintaining a pseudo-kinematic state between the base assembly 1808 and the foundation reduces the amount of strains/distortions in the base assembly 1808, hence maintaining the relative positions of the payload assemblies 1810.

Thermal Compensation

Figure 19:
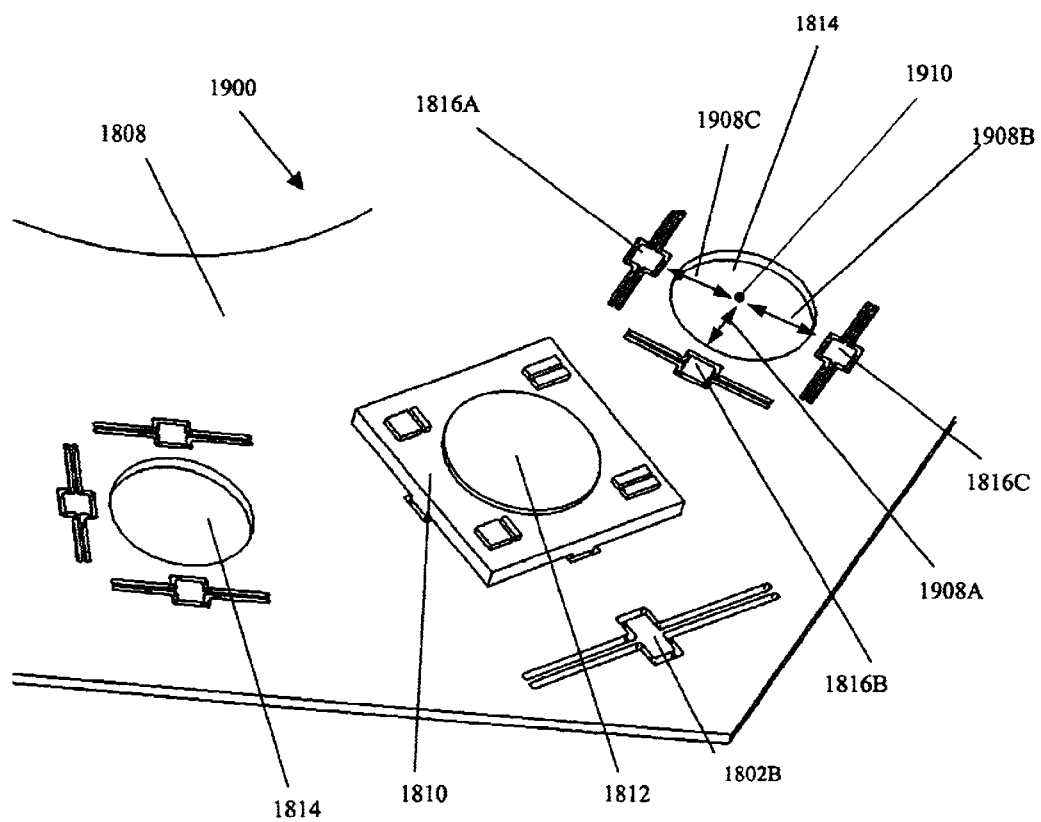
FIG. 19 is a three-dimensional view of one embodiment of a thermal compensation flexure assembly.

FIG. 19 illustrates a part of the base assembly 1808 in FIG. 18, a payload assembly 1810, an optical element 1812 supported by the payload assembly 1810, an outer internal flexure assembly 1802, a hole 1814 and a set of inner internal flexure assemblies 1816A–1816C around the hole 1814. One or more optical elements 1812 may be inserted in each hole 1814. The payload assembly 1810 (e.g., silicon optical bench) in FIG. 19 is directly connected to the base assembly 1808, and the connection points are flexured to attain a pseudo-kinematic state.

In other embodiments, there may be more than three or less than three inner internal flexure assemblies 1816A–1816C. The inner internal flexure assemblies 1816A–1816C may be oriented 120 degrees apart or oriented at any arbitrary angle or distance or angle from each other, preferably with the lines-of-action 1908A–1908C meeting at a common point (e.g.1910). For example, the inner internal flexure assemblies 1816A–1816C in FIG. 19 are oriented 90 degrees apart.

The inner internal flexure assemblies 1816A–1816C in FIG. 19 may be referred to as thermal compensation flexures, which may be used to maintain hot die passive alignment. The inner internal flexure assemblies 1816A–1816C together may be called a thermal compensation flexure assembly.

FIG. 19 illustrates three lines of action 1908A–1908C that intersect at a centroid 1910. The three lines of action 1908A–1908C represent degrees of flexibility or soft DOFs provided by the inner internal flexure assemblies 1816A–1816C. An optical element 1812, such as a diode, will expand as the element 1812 rises in temperature (generates or absorbs heat). Thus, the optical element 1812 and its payload assembly 1810 will attempt to increase in size relative to the payload assembly's attachment points to the base assembly 1808. Because the inner internal flexure assemblies 1816A–1816C allow for or compensate temperature-induced distortions along the lines of action 1908A–1908C, the expanding optical element 1812 and its payload assembly 1810 will not cause any warping or stresses to the base assembly 1808. The optical element 1812 and the payload assembly 1810 will be at substantially the same temperature and hence will generate no internal stresses or distortions (other than simple expansion).

The inner internal flexure assemblies 1816A–1816C also maintain the center of the expanding payload assembly 1810 (and optical element 1812) at the centroid 1910 of the flexure systems lines-of-action. In some applications, maintaining centration of the expanding optical element 1812 is critical. For example, an incident laser beam may be required to remain at a certain spatial position on a diode. The spatial position for instance, is the center of the diode. With a thermal compensation flexure assembly in FIG. 19, the laser beam will remain at its spatial position even when the diode expands or contracts. If the diode expands or contracts, the neutral point is the center of the diode, and the center of the diode will not move spatially laterally, relative to the base assembly 1808.

Chuck Array

Figure 20:
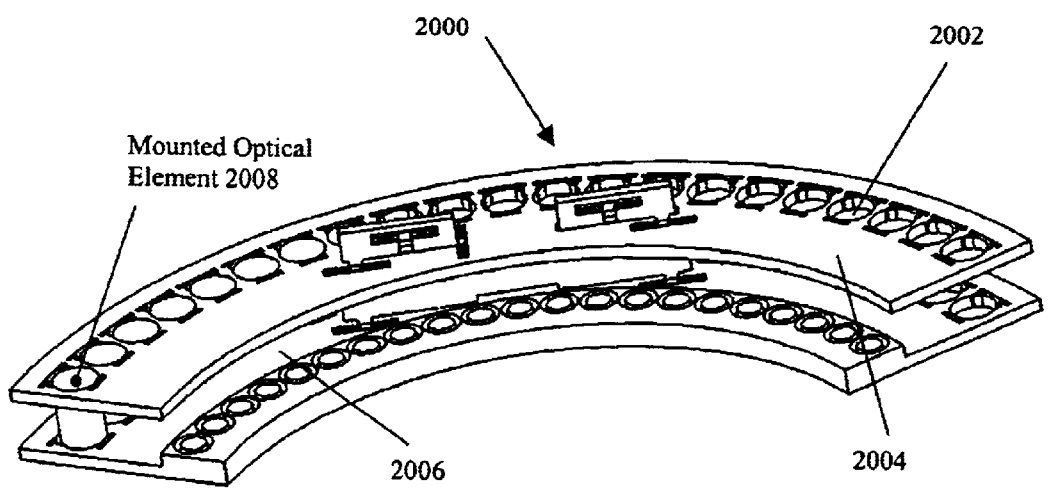
FIG. 20 is a three-dimensional view of one embodiment of a micromachined passive alignment assembly with a plurality of chucks in the base assembly and payload assembly for aligning optical elements.

FIG. 20 is a three-dimensional view of one embodiment of a micromachined alignment assembly 2000, which comprises a base assembly 2006 and a payload assembly 2004 (also called "chuck arrays" or "wafers" or "planar objects"). In another embodiment the top structure 2004 may be the base, and the bottom structure 2006 may be the payload. The micromachined alignment assembly 2000 in FIG. 20 may constitute a view of one-third of a two-piece, ring-shaped alignment assembly. The base assembly 2006 and payload assembly 2004 each comprise an array of micromachined chucks or holes 2002 for restraining and aligning arrays of optical elements 2008, such as mounted lenses, fibers, or mirrors. The chucks 2002 may be formed by one or more processes described in the above-referenced U.S. Patent Application, entitled "OPTICAL ELEMENT SUPPORT STRUCTURE AND METHODS OF USING AND MAKING THE SAME" Ser. No. 10/001092, which is hereby incorporated by reference in its entirety.

Figure 21:
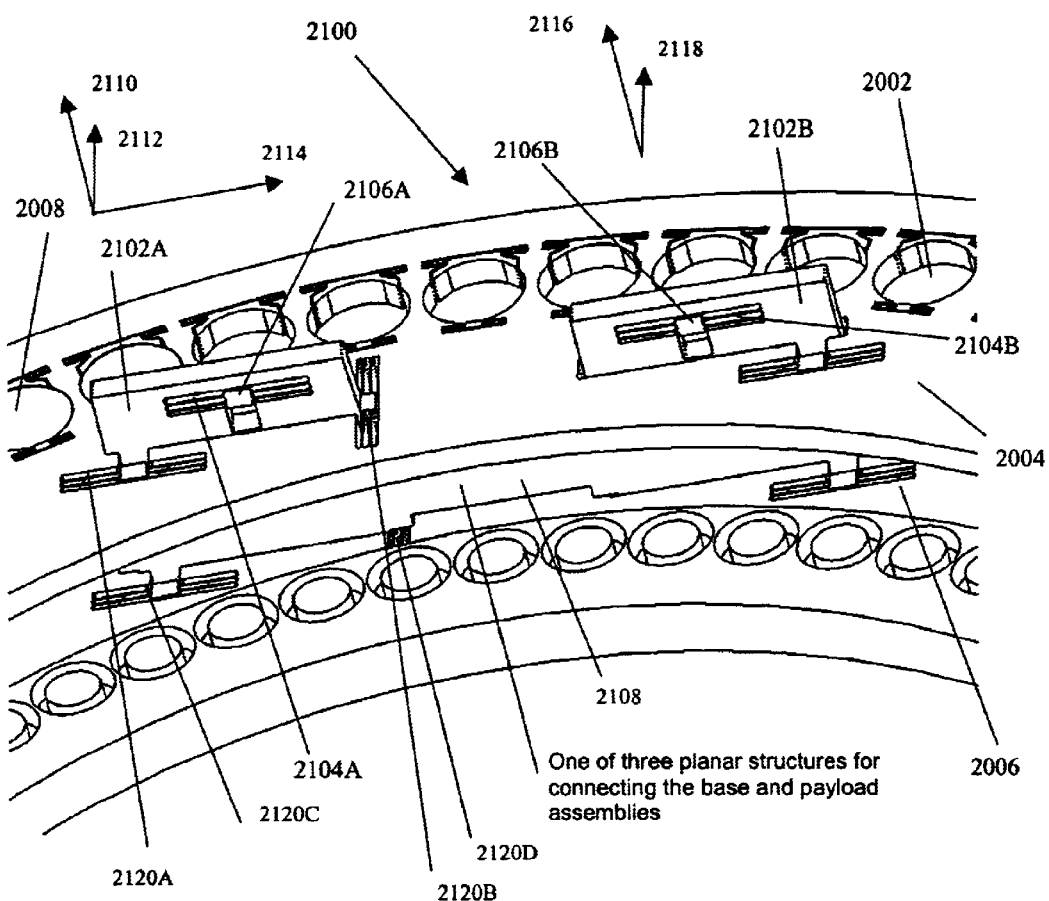
FIG. 21 is an enlarged three-dimensional view of one part of the micromachined alignment assembly in FIG. 20.

FIG. 21 is an enlarged three-dimensional view 2100 of one part of the micromachined alignment assembly 2000 ("chuck array") in FIG. 20. FIG. 21 illustrates a bipod-style connecting element 2108 (e.g., a planar structure) with two tabs 2102A–2102B for pseudo-kinematic (low distortion) or redundant (planarity enforcing) attachment of the base assembly 2006 and the payload assembly 2004. An alignment assembly may comprise two ring-shaped structures, which are partially shown in FIGS. 20 and 21, and a plurality of bipod-style connecting elements (e.g., three), such as the bipod-style connecting element 2108 in FIG. 21.

In one embodiment, each connecting tab 2102A, 2102B in FIG. 21 is a planar structure with two stiff DOFs. DOFs 2110, 2112, 2114 are controlled at the payload assembly 2004. DOFs 2110, 2114 are used by the payload assembly 2004, and DOF 2112 is used by the connector tab 2102A. DOFs 2116, 2118 are redundant, which may or may not be used. DOF 2116 may be used by the payload assembly 2004 to enforce planarity, and DOF 2118 may be used by the connecting structure 2108 to enforce planarity.

With three bipod-style connecting elements, such as the bipod-style connecting element 2108 in FIG. 21, the payload assembly 2004 and the base assembly 2006 may be supported by a total of six stiff DOFs. The connector tabs 2102A–2102B have internal flexure assemblies 2104A, 2104B that provide compliance in the vertical direction for preloader stages 2106A, 2106B, which in turn may be used (with a preloader pin, not shown) to provide preload to controlled DOFs 2110 and 2116. Similar to the vertical preload example of FIG. 9, a possibly redundant rotational constraint normal to the plane of connecting structure 2108 may also be created. The micromachined alignment assembly 2000 shown in FIGS. 20 and 21 may accurately control the lateral positions of the payload assembly 2004 with respect to the base assembly 2006, and thus control the lateral positions (desired orientation) of upper and lower portions of the optical elements 2008.

In one embodiment, each bipod-style connecting element 2108 utilizes neighboring flexure systems in the base and payload wafers 2006, 2004 to provide preloading for the other DOFs indicated in FIG. 21. For example, a first connecting tab 2102A of the bipod-style connecting element 2108 in FIG. 21 has neighboring flexure systems 2120A and 2120B. FIG. 11 shows a top view of a connecting tab 1106 that may represent connecting tab 2102A in FIG. 21. The two flexure systems 2120A and 2120B, together with their respective preloader stages and preloader pins (not shown) allow for application of preload to control DOFs 2112 and 2114. Flexure systems 2120C, 2120D provide similar capability at the attachment of 2108 to the base assembly 2006.

The connecting structures between two objects (e.g., a base and a payload) disclosed herein may be pseudo-kinematically supported, which allows the connecting structures to be used for precision positioning and distortion free support of optical components.

Optical Element Support Structure

Figure 22:
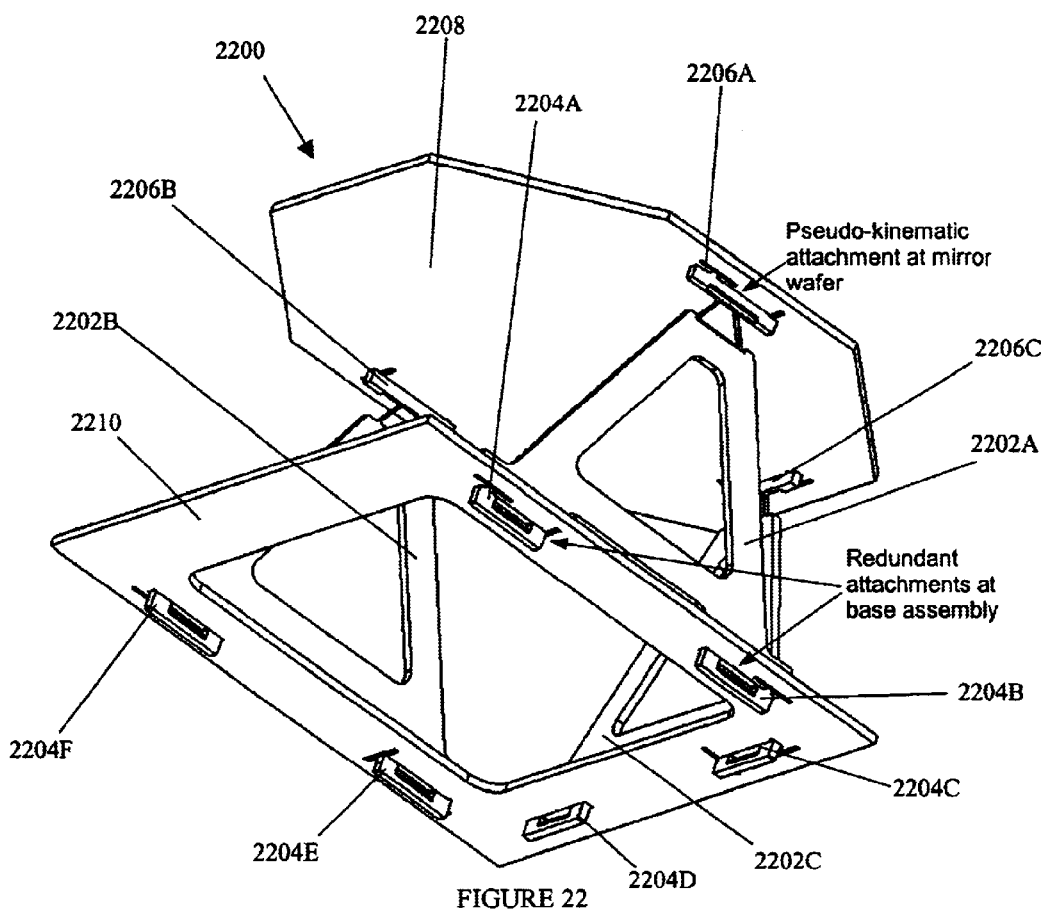
FIG. 22 is a three-dimensional view of one embodiment of an assembly, which comprises a first structure, a plurality of connecting elements and a second structure.

FIG. 22 is a three-dimensional view of one embodiment of an assembly 2200, which comprises a first structure 2210 (e.g., a base assembly or a payload assembly), a plurality of connecting elements 2202A–2202C and a second structure 2208 (e.g., a base assembly, a payload assembly or an optical element, such as a mirror). In one configuration, the assembly 2200 may be an all-silicon fold mirror.

Other embodiments of the assembly 2200 may have less than three or more than three connecting elements. The connecting elements 2202A–2202C have redundant attachment points 2204A–2204F on one end and pseudo-kinematic attachment points 2206A–2206C on the other end. The six redundant attachment points 2204A–2204F may connect to the first structure 2210. The three pseudo-kinematic attachment points 2206A–2206C may connect to the second structure 2208.

Other embodiments of the connecting elements 2202A–2202C may have less or more attachment points.

Figure 23:
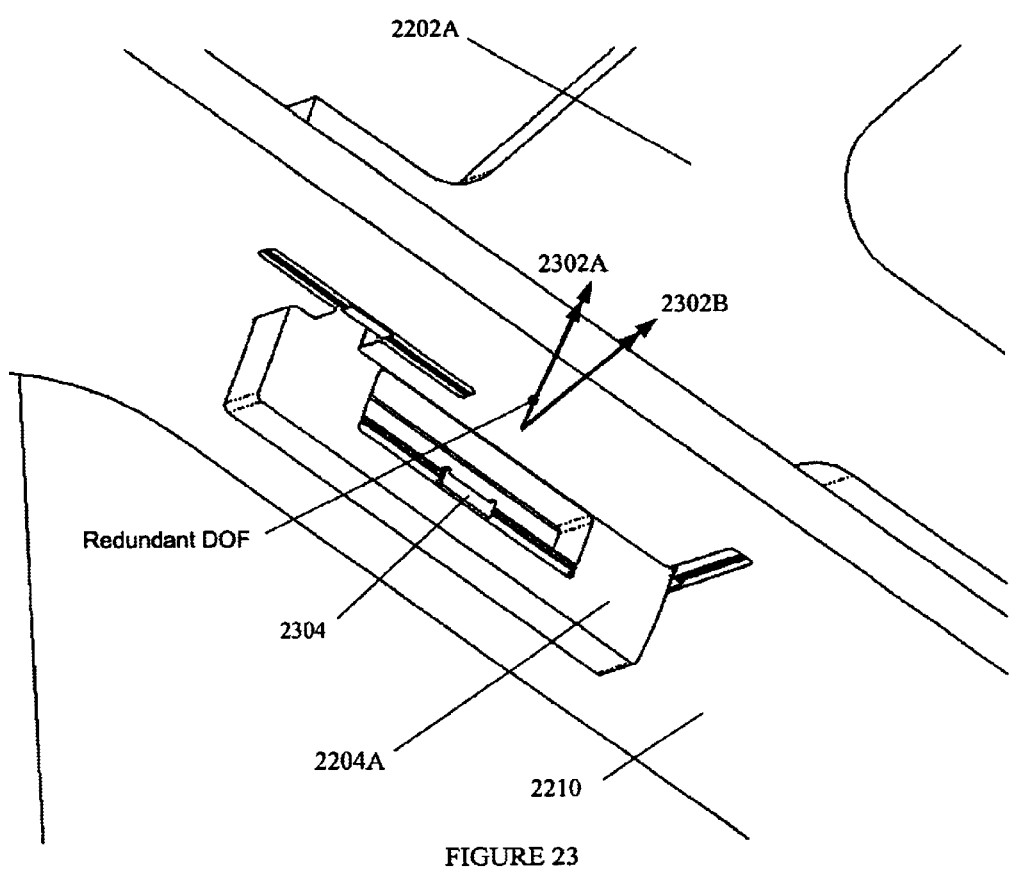
FIG. 23 is an enlarged view of a redundant attachment point of one connecting element in FIG. 22.

FIG. 23 is an enlarged view of a redundant attachment point 2204A of one connecting element 2202A in FIG. 22. The redundant attachment points 2204A–2204F of the connecting elements 2202A–2202C in FIG. 22 attach to the base assembly 2210 collectively with more than six stiff DOFs. In FIG. 23, the redundant attachment point 2204A is connected to the base assembly 2210 with two possibly stiff DOFs 2302A–2302B, in addition to the DOFs (e.g., three translations) used for pseudo-kinematic attachment. Similarly, the redundant attachment points 2204B–2204F are each connected to the base assembly 2210 with two additional possibly stiff DOFs (not shown). Therefore, the three connecting elements 2202A–2202C attach to the base assembly 2210 with twelve additional possibly stiff DOFs.

In some applications, other designs for the connecting elements may be used to attach the base assembly in more than six DOFs. For example, a connecting element may have three redundant attachment points. The rationale for allowing these redundant DOFs in this assembly is the same as discussed in the section "Redundant Elements for Additional Stiffness/Planarity Enforcement" (e.g., enforcing the planarity of the base and/or connecting elements).

Figure 24:
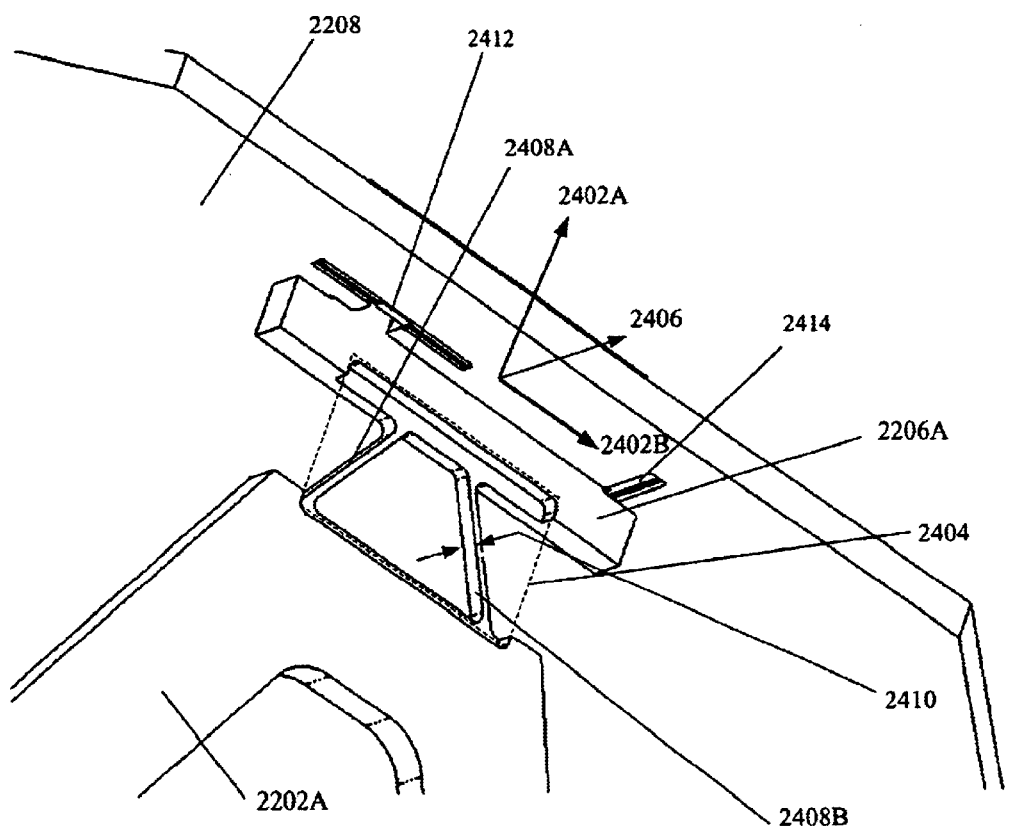
FIG. 24 is an enlarged view of a pseudo-kinematic attachment point of one connecting element in FIG. 22.

FIG. 24 is an enlarged view of a pseudo-kinematic attachment point 2206A (also called mounting tab) of one connecting element 2202A in FIG. 22. The attachment point 2206A in FIG. 24 may embody some or all of the principles of kinematic support and position control described above. The pseudo-kinematic attachment points 2206A–2206C of the connecting elements 2202A–2202C in FIG. 22 attach to the optical element 2208 collectively with six stiff DOFs. FIG. 24 illustrates one pseudo-kinematic attachment point 2206A with two stiff DOFs 2402A, 2402B. Similarly, the other pseudo-kinematic attachment points 2206B, 2206C are connected to the optical element 2208, each with two stiff DOFs (not shown).

In one embodiment, each pseudo-kinematic attachment point 2206 has a flexure system 2408A and 2408B (FIG. 24) that is designed to provide an appropriate stiffness to form a ball joint with stiff DOFs 2402A, 2402B, 2406. DOFs 2402A, 2402B pseudo-kinematically support the mirror wafer 2208, and DOF 2406 is a constraint borrowed back from the optical element 2208 to support the end of the connecting element 2202A.

In one embodiment, the pseudo-kinematic attachment point 2206A uses positive preloaders (or preloading stage) to attach the connecting element 2202A to the optical element 2208 without deadband, such that DOFs 2402A, 2402B, 2406 are precisely specified and controlled (i.e., possess high stiffness). In one configuration, the pseudo-kinematic attachment point 2206A uses three preloaders. One preloader 2412 applies a preload against a surface of the pseudo-kinematic attachment point 2206A using a preloader pin (not shown) to precisely specify and control DOF 2406. Another preloader 2414 applies a preload against another surface (e.g., end of the tab in the slot) of the pseudo-kinematic attachment point 2206A without a pin (see FIGS. 9, 11) to precisely specify and control DOF 2402B.

A vertical preloader (not shown) in an upper portion of the attachment point 2206A that protrudes above the optical element 2208 is similar to the preloader stage 2304 in the redundant attachment point 2204A in FIG. 23. The vertical preloader stage in the pseudo-kinematic attachment point 2206A provides a preload in DOF 2402A. The vertical preloader stage uses a preloader pin.

The flexure system 2405 has two flexure elements 2408A–2408B that form a bipod-like structure. The two flexure elements 2408A–2408B intersect at a virtual point in the pseudo-kinematic attachment point 2206A and hence form a "ball joint" as previously described.

In one embodiment, the flexure system 2405 in FIG. 24 is recessed using an extra micromachining step (an etch defined by the square area 2404), to decrease the depth 2410 of the flexure elements 2408A–2408B. The flexure blade depth 2410 is then variable and not fixed as the thickness of the wafer. Thus, flexure properties may be more readily tailored to achieve a desired pseudo-kinematic stiffness connectivity. For example, if the flexure elements 2408A–2408B are thinned sufficiently, they would behave more like rods, and thus more perfectly constrain only two DOFs, i.e., have larger separation of stiffness between desired and undesired constraint DOFs.

The connecting elements 2202A–2202C in FIG. 22 may be fabricated using the manufacturing procedures described herein. For example, lithography and micromachining can fabricate the connecting elements 2202A–2202C with high intrinsic precision. In one embodiment, a recessed flexure system (e.g., 2408A and 2408B in FIG. 24) in each connecting element 2202 is formed by a patterning process, such as lithography, that forms a desired pattern, such as a rectangle, of the recessed flexure system 2405 on one side of a substrate wafer. Then the rectangular area is partially etched through the substrate wafer until a desired depth 2410 for the flexure elements 2408A–2408B remains. The flexure system 2405 could then be etched from the other side using an appropriate mask pattern to form the flexure elements 2408A–2408B.

In another embodiment, a patterning process such as lithography may be used to form a desired pattern of the flexure elements 2408A–2408B on a substrate wafer. Next, a micromachining process such as an etching process may be used to etch through the substrate wafer to a predetermined depth for thinning down the depth 2410 of the flexure elements 2406A–2406B. After the micromachining process, the substrate wafer is cleansed. Next, the substrate wafer may be subjected to a second patterning process. Then, the substrate wafer may be subjected to a second micromachining process to etch through the whole substrate wafer. Finally, the substrate wafer is cleansed and then assembled to provide the desired micromachined passive alignment assembly.

Megastack

Figure 25:
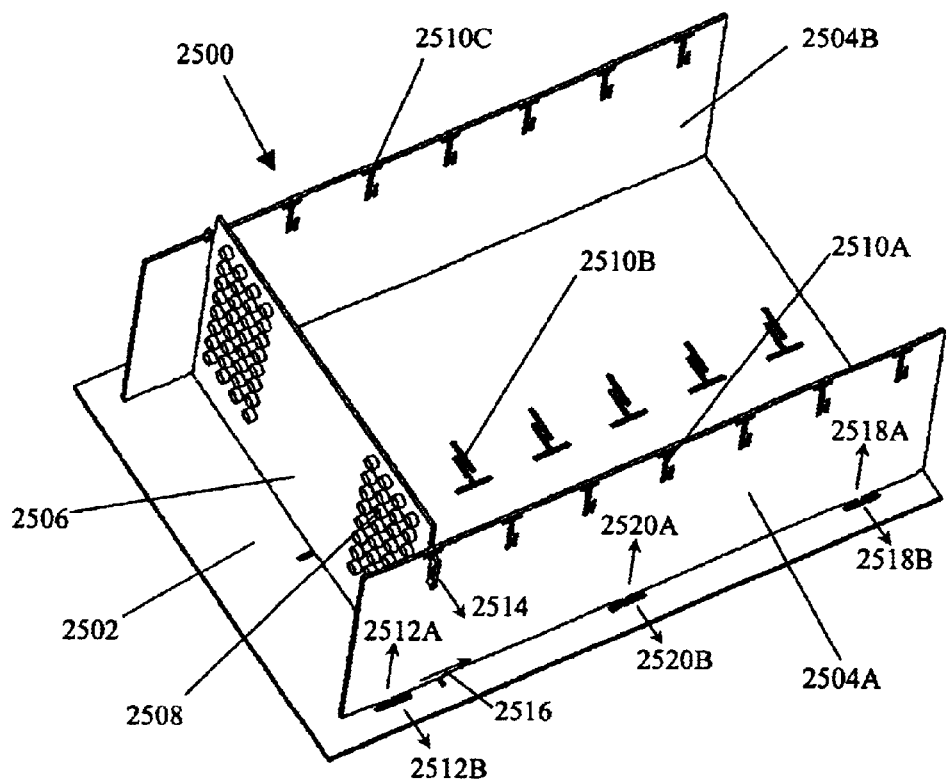
FIG. 25 is a three-dimensional view of one embodiment of a megastack structure.

FIG. 25 is a three-dimensional view of one embodiment of a megastack structure 2500. The megastack structure comprises a base plate 2502 and one or more side plates 2504A, 2504B. The configuration with one sideplate 2504 may be referred to as an "L-type megastack," and the configuration with two side plates 2504A, 2504B, shown in FIG. 25, may be referred to herein as a "C-type megastack." The megastack structure 2500 enables precise dimensional support of an arbitrarily large number of payload assemblies 2506, which may comprise silicon wafers with MEMs devices or integral or mounted optical devices. Optical elements 2508 may be mounted, restrained, and/or aligned on a payload assembly 2506. In some applications, a side plate 2504 may also serve as a payload assembly that mounts, restrains, and/or aligns optical elements.

As shown in FIG. 25, the megastack structure 2500 has precisely-formed attachment points 2510A–2510C (also called "slots") to support and align each payload assembly 2506. Each attachment point 2510 provides two-DOF positioning control in the C type megastack configuration to attain a pseudo-kinematic support condition.

The side plates 2504A–2504B may or may not be kinematically attached to the base plate 2502. As shown in FIG. 25, DOFs 2512A, 2512B, 2514, 2516, 2518A, 2518B are used to kinematically support the side plate 2504A. The DOF 2514 is "borrowed" from a payload assembly 2506 (or other structural element) to create a kinematic support condition. The side plate 2504A is also attached to the base plate 2502 via redundant DOFs 2520A–2520B. The redundant DOFs 2520A, 2520B may be allowable because their directions support the attached plates 2504A–2504B in DOFs that have an associated soft stiffness of plate out-of-plane bending. The redundant DOFs 2520A, 2520B may therefore preserve the flatness in both the base plate 2502 and the side plate 2504A.

In other embodiments, it may be desirable to have a degenerate or a redundant support system for a C-type or L-type megastack structure 2500. If a degenerate support system is desired, the megastack structure 2500 may support and/or align the payload assembly 2506 using less than three attachment points 2510. If a redundant support system is desired, the megastack structure 2500 may support and/or align the payload assembly 2506 using more than three attachment points 2510.

The attachment points 2510A–2510C (FIG. 25) are geometrically positioned such that two attachment points 2510A and 2510C are elevated above the base plate 2502, and one attachment point 2510B is in the plane of the base plate 2502. This geometrical attachment arrangement, or other similar arrangements, when combined with the specific directions of local DOF support, produce a non-degenerate, non-redundant, pseudo-kinematic support for a payload plate 2506.

As another example, an L-type megastack may have two attachments points on a base plate and one attachment point elevated above the baseplate plane on a sideplate. Here the local DOF supported at each attachment point are in different directions from the pictured C-type megastack 2500 in FIG. 25.

Figure 26:
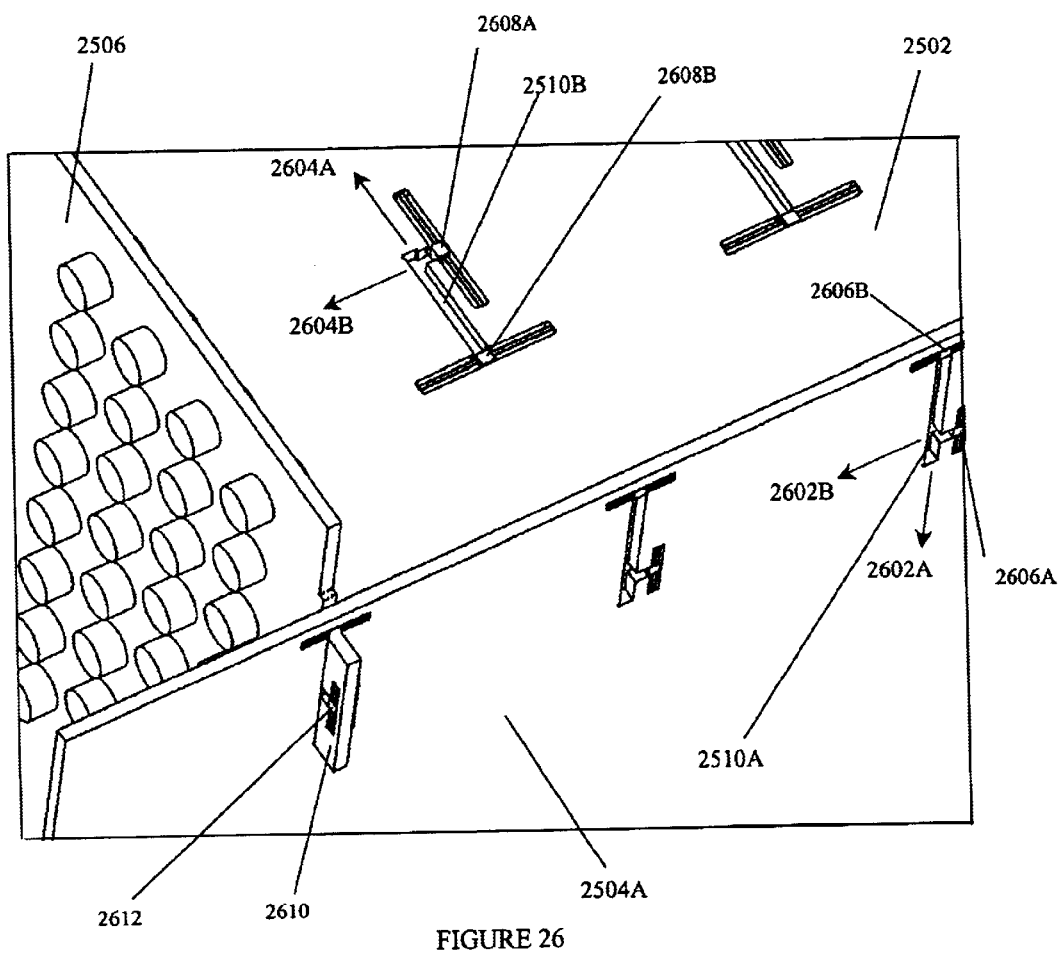
FIG. 26 is an enlarged view of some attachment points of the side plate and the base plate in FIG. 25.

FIG. 26 is an enlarged view of some attachment points 2510A, 25101B of the side plate 2504A and the base plate 2502 in FIG. 25. Given the geometric position of the attachment points 2510A–2510C (FIG. 25), a C-type megastack payload assembly structure 2506 is pseudo-kinematically supported by two precisely-controlled DOFs 2602A, 2602B (FIG. 26) from attachment point 2510A, two DOFs 2604A, 2604B from attachment point 2510B, and two DOFs (not shown) from attachment point 2510C (FIG. 25). The two DOFs (not shown) from attachment point 2510C are similar to the two DOFs 2602A, 2602B (FIG. 26) from attachment point 2510A.

In FIGS. 25 and 26, flexure systems with integral preloaders 2606A, 2606B, 2608A, 2808B may be implemented for maximum positioning precision. For example, preloader 2608B preloads a tapered tab (not shown) of a payload assembly 2506 to seat the tab against the slot 25101B in DOF 2604A, which forms a tab-in-slot configuration as shown in FIGS. 9 and 11. Preloader 2608A may use a tapered pin (not shown) to preload the tab (not shown) of a payload assembly 2506 against the slot 2510B in DOF 2604B. Similarly, the preloaders 2606A, 2606B may preload a tab, such as tab 2610, in DOFs 2602B, 2602A, respectively. The tab 2610 may have a preloader 2612.

Figure 27:
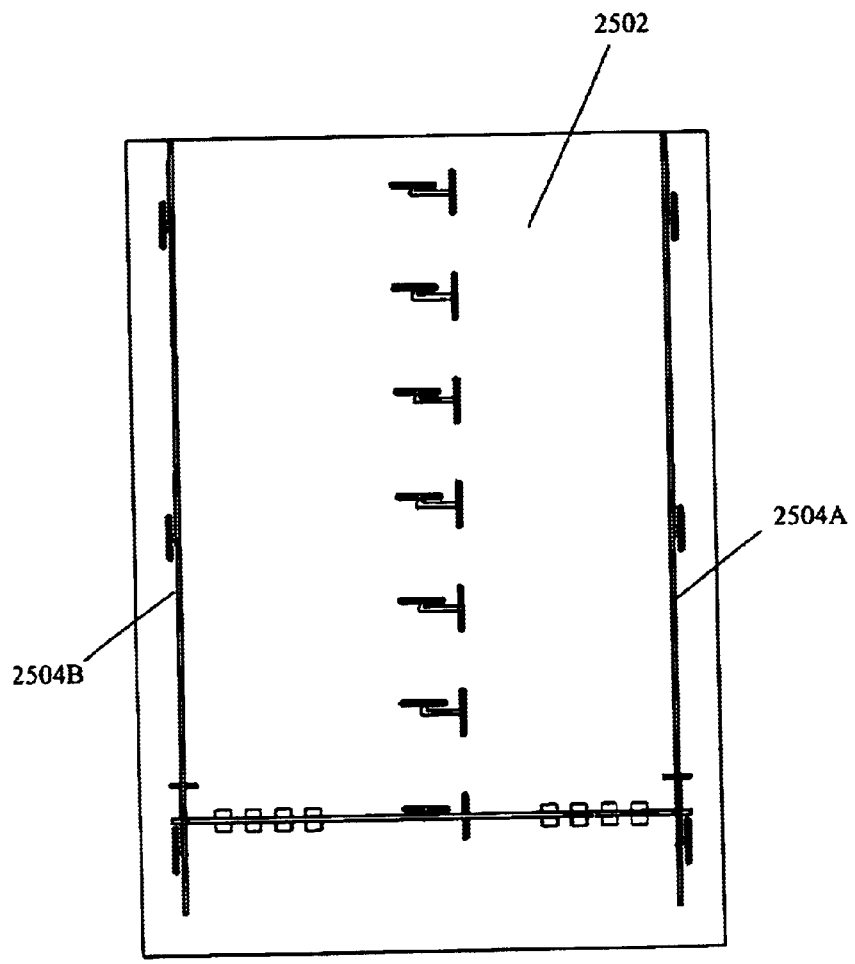
FIG. 27 is the top view of the megastack structure in FIG. 25.

FIG. 27 is the top view of the megastack structure 2500 in FIG. 25.

Figure 28:
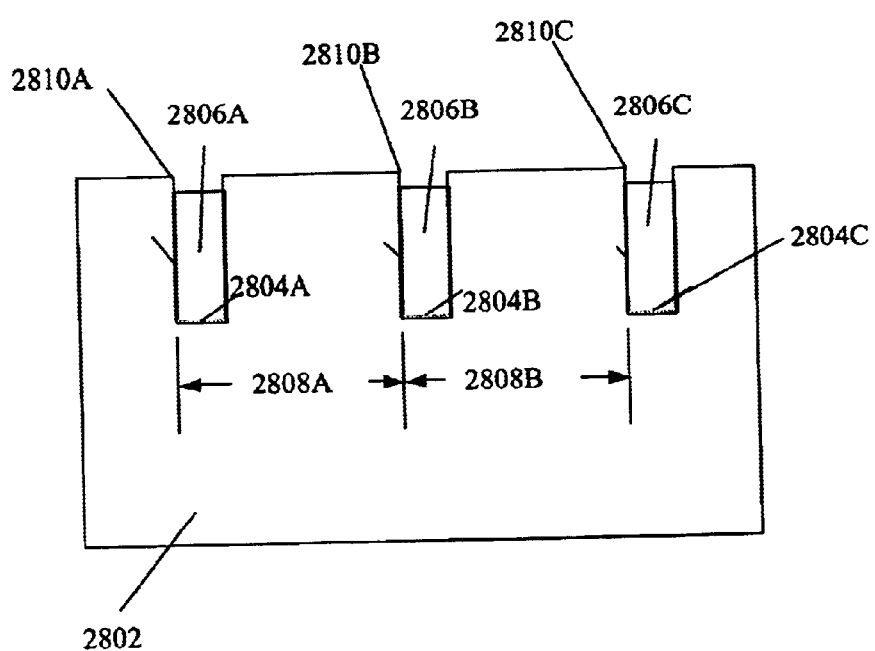
FIG. 28 is a side view of one embodiment of a side plate in FIG. 25.

FIG. 28 is the side view schematic of one embodiment of a side plate, such as the sideplate 2504A in FIG. 25. The side plate 2802 in FIG. 28 is another example of planar positioning accuracy. The side plate 2802 has three slots 2804A–2804C for engaging three tabs 2806A–2806C of three payload assemblies, such as the payload wafer 2506 in FIG. 25. In FIG. 28, the slots 2804A–2804C are open-ended at a top side. In FIG. 25, the side plates 2504A, 2504B have slots 2510A, 2510B that are closed-ended at all sides and form a window opening in the side plates 2504A, 2504B. Similarly, the base 2502 in FIG. 25 has slots 2510B that are closed-ended at all sides and form a window opening in the base assembly 2502.

The side plate 2802 in FIG. 28 may precisely control two DOFs on each of the three tabs 2806A–2806C of attached payload wafers (FIG. 25). The vertical edges 2810A–2810C of the slots 2804A–2804C may allow precise definition of the horizontal separation 2808A, 2808B between the three tabs 2806A–2806C (even more precise if the tabs 2806A–2806C are preloaded against the slots 2810A–2810C). The horizontal (bottom) edges of the slots 2804A–2804C provide a vertical reference between the tabs 2806A–2806C (again, even more precise when the tabs 2806A–2806C are preloaded against the bottom edges).

The side plate 2802 in FIG. 28 may be used in conjunction with one or two other similar objects (each appropriately connected to the others) to completely define the positions and orientations of three payload wafers, which each have a plurality of tabs (FIG. 28 shows tabs 2806A–2806C of three payload wafers).

In some applications, it is desirable to have the side plate 2802 with slots 2804A–2804C that are equidistant from one another, as shown by distances 2808A–2808B. An equidistant arrangement may allow proper alignment of the payload assemblies.

Figure 29:
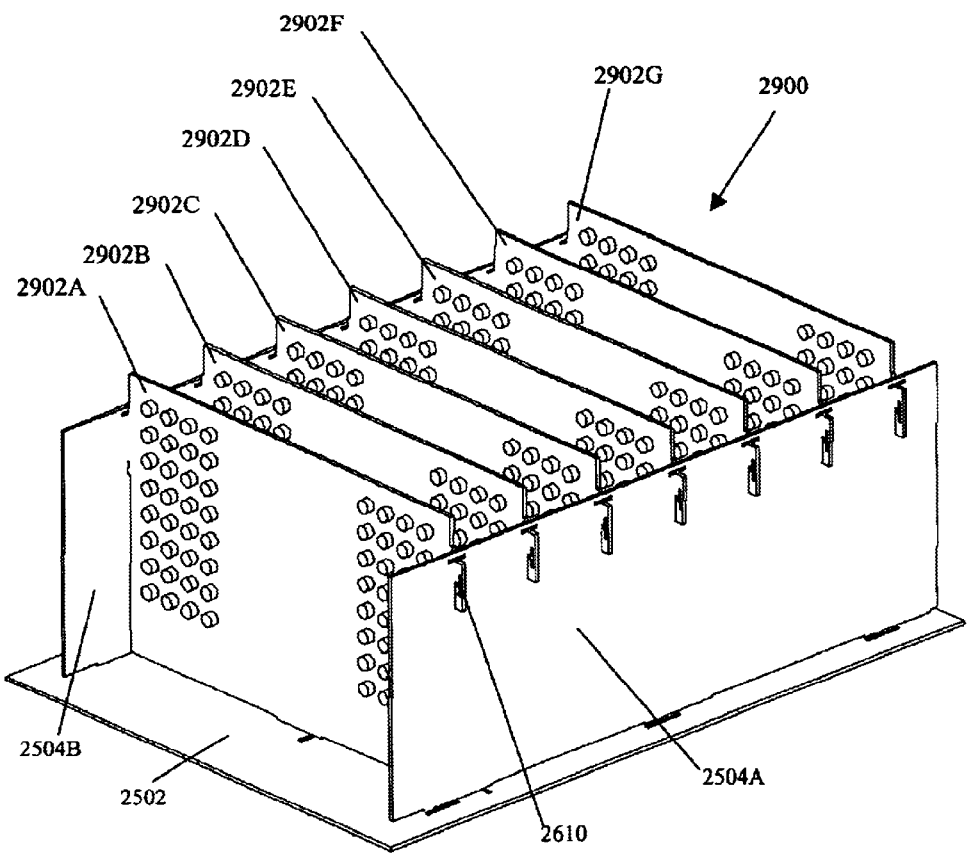
FIG. 29 is a three-dimensional view of a complete megastack structure, which is shown partially in FIG. 25.

FIG. 29 is a three-dimensional view of a complete megastack structure 2900, which is shown partially in FIG. 25, with a plurality of payload assemblies 2902A–2902G. The complete megastack structure 2900 in FIG. 29 comprises side plates 2504A, 2504B, a base plate 2502, tabs (such as tab 2610), slots, internal flexure assemblies, payload assemblies 2902A–2902G, optical elements (collectively referred to as "components"), as described above. The attachment mechanisms maintain the complete megastack structure 2900 in a pseudo-kinematic state.

Figure 30:
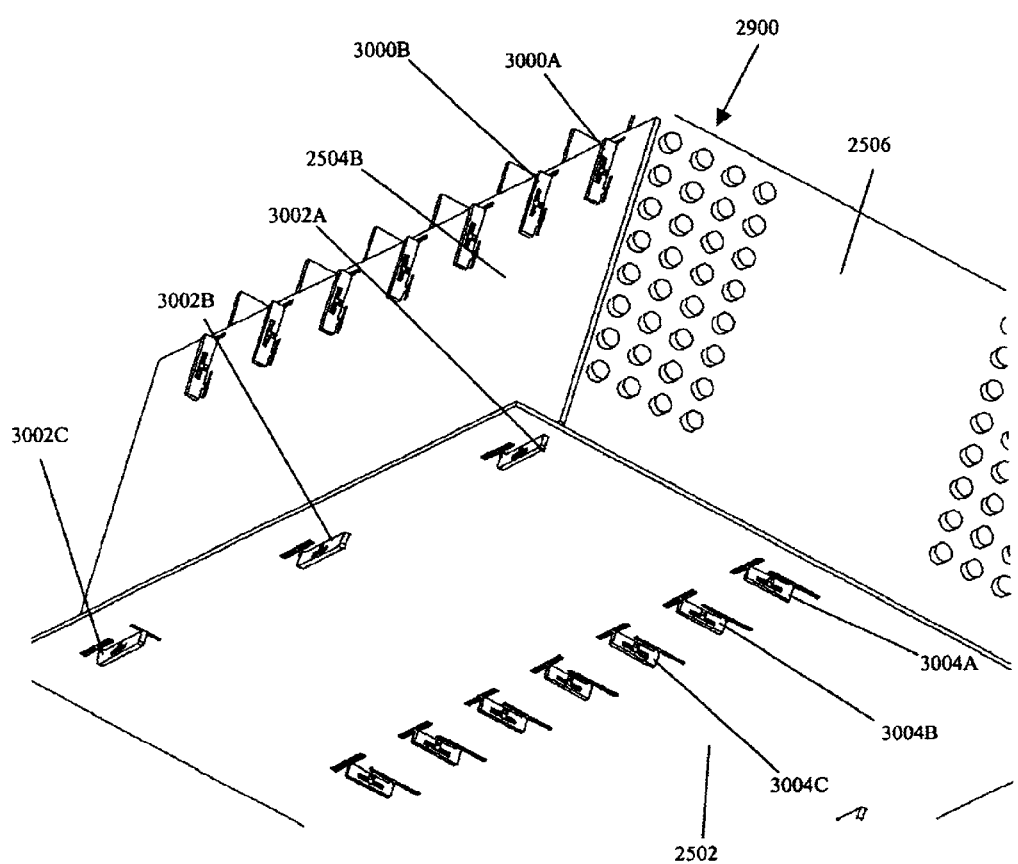
FIG. 30 is the three-dimensional bottom view of the megastack structure in FIG. 29.

FIG. 30 is a three-dimensional bottom view of the complete megastack structure 2900 in FIG. 29. FIG. 30 shows one side plate 2504B, the base plate 2502, one payload assembly 2506, bottom tabs 3002A–3002C of the side plate 2504B and bottom tabs 3004A–3004C of three payload assemblies. The bottom tabs 3002A–3002C and bottom tabs 3004A–3004C protrude from the bottom surface of the base plate 2502.

The complete megastack structure 2900 in FIGS. 29 and 30 may be fabricated using the same manufacturing procedures described herein. For example, using the lithography process and the micromachining process to fabricate the tabs, slots, internal flexure assemblies, payload assemblies, sideplate assemblies, and base assemblies.

FIG. 31 illustrates one method of designing the three-dimensional structures and assemblies described above and translating the designs into masks for high precision microlithography/photolithography. The actions described in FIG. 31 may be performed in the order as shown or in alternative orders. Some of the actions may be skipped or combined with other actions. The method of FIG. 31 may include other actions in addition to or instead of the actions shown.

FIG. 32 illustrates one method of making high precision, three-dimensional structures described above. The actions described in FIG. 32 may be performed in the order as shown or in alternative orders. Some of the actions may be skipped or combined with other actions. The method of FIG. 32 may include other actions in addition to or instead of the actions shown.

FIG. 33 illustrates one method of assembling three-dimensional structures described above from planar parts. The actions described in FIG. 33 may be performed in the order as shown or in alternative orders. Some of the actions may be skipped or combined with other actions. The method of FIG. 33 may include other actions in addition to or instead of the actions shown.

The above-described embodiments of the present invention are merely meant to be illustrative and not limiting. Various changes and modifications may be made without departing from the invention in its broader aspects. The appended claims encompass such changes and modifications within the spirit and scope of the invention.

What is claimed is:

1. An assembly configured to support at least one optical element to a pre-determined position, the assembly comprising:

a first micromachined structure having three protrusions, each protrusion having a pre-determined height; and a second micromachined structure having three grooves, each groove having a pre-determined depth, the depth of each groove being less than a height of each protrusion, each groove being configured to contact one of the protrusions and control the protrusion in two degrees of freedom when a preload is applied to the assembly, the grooves and protrusions being configured to constrain the second micromachined structure in only six degrees of freedom with respect to the first micromachined structure, the second micromachined structure being configured to support at least one optical element.

2. The assembly of claim 1, wherein the assembly comprises a passive alignment assembly.

3. The assembly of claim 1, wherein the second mating part is configured to contact the first mating part to constrain the second micromachined structure with respect to the first micromachined structure in six degrees of freedom, the six constrained degrees of freedom comprising:

three orthogonal translational positions constrained to less than one micron; and three orthogonal angular position constrained to less than five arcseconds.

4. The assembly of claim 1, wherein the first and second micromachined structures are fabricated using a lithographic micromachining process.

5. The assembly of claim 1, wherein the first micromachined structure is also configured to support at least one optical element.

6. The assembly of claim 5, wherein a first optical element supported by the first micromachined structure is aligned with a second optical element supported by the second micromachined structure.

7. The assembly of claim 1, wherein the second micromachined structure is configured to position the optical element with respect to the first micromachined structure.

8. The assembly of claim 1, wherein the first micromachined structure comprises a substrate with at least a first receptacle, the second micromachined structure comprises a substrate with at least a second receptacle, the pairing of the first receptacle and the second of receptacle being configured to align an optical element with about six constrained degrees of freedom.

9. The assembly of claim 1, wherein the optical element is an optical fiber.

10. The assembly of claim 1, wherein the optical element is a lens.

11. The assembly of claim 1, wherein the optical element is a mirror.

12. The assembly of claim 1, wherein the optical element is a diode.

13. The assembly of claim 1, wherein the first and second micromachined structures are formed from substantially flat silicon wafers.

14. The assembly of claim 1, wherein the first and second micromachined structures comprise substantially planar wafers.

15. The assembly of claim 1, wherein the first mating part and the second mating part comprise a plurality of slip-fit joint assemblies.

16. The assembly of claim 1, wherein the first mating part comprises a plurality of slots and the second mating part comprises a plurality of tabs configured to fit into the slots.

17. The assembly of claim 1, wherein the first micromachined structure comprises a rib, the first mating part comprises a plurality of attachment points and the second mating part comprises a plurality of slots configured to receive the attachment points.

18. The assembly of claim 17, wherein the attachment points comprise tabs.

19. An assembly configured to support at least one optical element, the assembly comprising:

a first micromachined structure having three protrusions, each protrusion having four sidewalls, each sidewall being substantially perpendicular to a plane of the first micromachined structure, each protrusion having a sidewall facing a center point of the first micromachined structure; and a second micromachined structure having three grooves, the grooves being configured to contact the protrusions to restrain the second micromachined structure with respect to the first micromachined structure in six degrees-of-freedom (DOFs), the second micromachined structure being configured to support at least one optical element at a pre-determined position.

20. The assembly of claim 19, wherein the second micromachined structure is restrained with respect to the first micromachined structure with glue.

* * * * *